US011942556B2

(12) United States Patent
Lin et al.

(10) Patent No.: US 11,942,556 B2
(45) Date of Patent: Mar. 26, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Yu-Ru Lin, Hsinchu (TW); Shu-Han Chen, Hsinchu (TW); Yi-Shao Li, Hsinchu (TW); Chun-Heng Chen, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 244 days.

(21) Appl. No.: 17/225,306

(22) Filed: Apr. 8, 2021

(65) Prior Publication Data

US 2022/0328698 A1 Oct. 13, 2022

(51) Int. Cl.
*H01L 29/06* (2006.01)
*H01L 21/02* (2006.01)
*H01L 21/3065* (2006.01)
*H01L 29/417* (2006.01)
*H01L 29/423* (2006.01)
(Continued)

(52) U.S. Cl.
CPC .... *H01L 29/78696* (2013.01); *H01L 21/0259* (2013.01); *H01L 21/3065* (2013.01); *H01L 29/0665* (2013.01); *H01L 29/41733* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78618* (2013.01)

(58) Field of Classification Search
CPC ......... H01L 29/42392; H01L 29/66545; H01L 21/0259; H01L 21/3065; H01L 29/0665; H01L 29/0673; H01L 29/0847; H01L 29/165; H01L 29/267; H01L 29/41733; H01L 29/42364; H01L 29/4958; H01L 29/66439; H01L 29/66553; H01L 29/6656; H01L 29/66636; H01L 29/66742; H01L 29/775; H01L 29/7848; H01L 29/78618; H01L 29/78696
See application file for complete search history.

(56) References Cited

U.S. PATENT DOCUMENTS 9,209,247 B2 12/2015 Colinge et al.
9,236,267 B2 1/2016 De et al.
9,412,817 B2 8/2016 Yang et al.
(Continued)

*Primary Examiner* — Eric A. Ward
(74) *Attorney, Agent, or Firm* — Birch, Stewart, Kolasch & Birch, LLP

(57) ABSTRACT

A device includes a first channel layer, a second channel layer, a gate structure, a source/drain epitaxial structure, and a source/drain contact. The first channel layer and the second channel layer are arranged above the first channel layer in a spaced apart manner over a substrate. The gate structure surrounds the first and second channel layers. The source/drain epitaxial structure is connected to the first and second channel layers. The source/drain contact is connected to the source/drain epitaxial structure. The second channel layer is closer to the source/drain contact than the first channel layer is to the source/drain contact, and the first channel layer is thicker than the second channel layer.

20 Claims, 28 Drawing Sheets

(51) Int. Cl.
    *H01L 29/66*     (2006.01)
    *H01L 29/786*     (2006.01)

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2014/0051213 A1* | 2/2014 | Chang ............... H01L 29/42392 |
| | | 257/E21.415 |
| 2016/0315167 A1* | 10/2016 | Nakamura ........ H01L 29/66742 |
| 2017/0256609 A1* | 9/2017 | Bhuwalka ......... H01L 29/78696 |
| 2020/0105929 A1* | 4/2020 | Zhang ................ H01L 29/1033 |
| 2020/0185539 A1* | 6/2020 | Lee ................... H01L 29/42376 |
| 2020/0395482 A1* | 12/2020 | Song .................. H01L 29/0847 |

\* cited by examiner

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
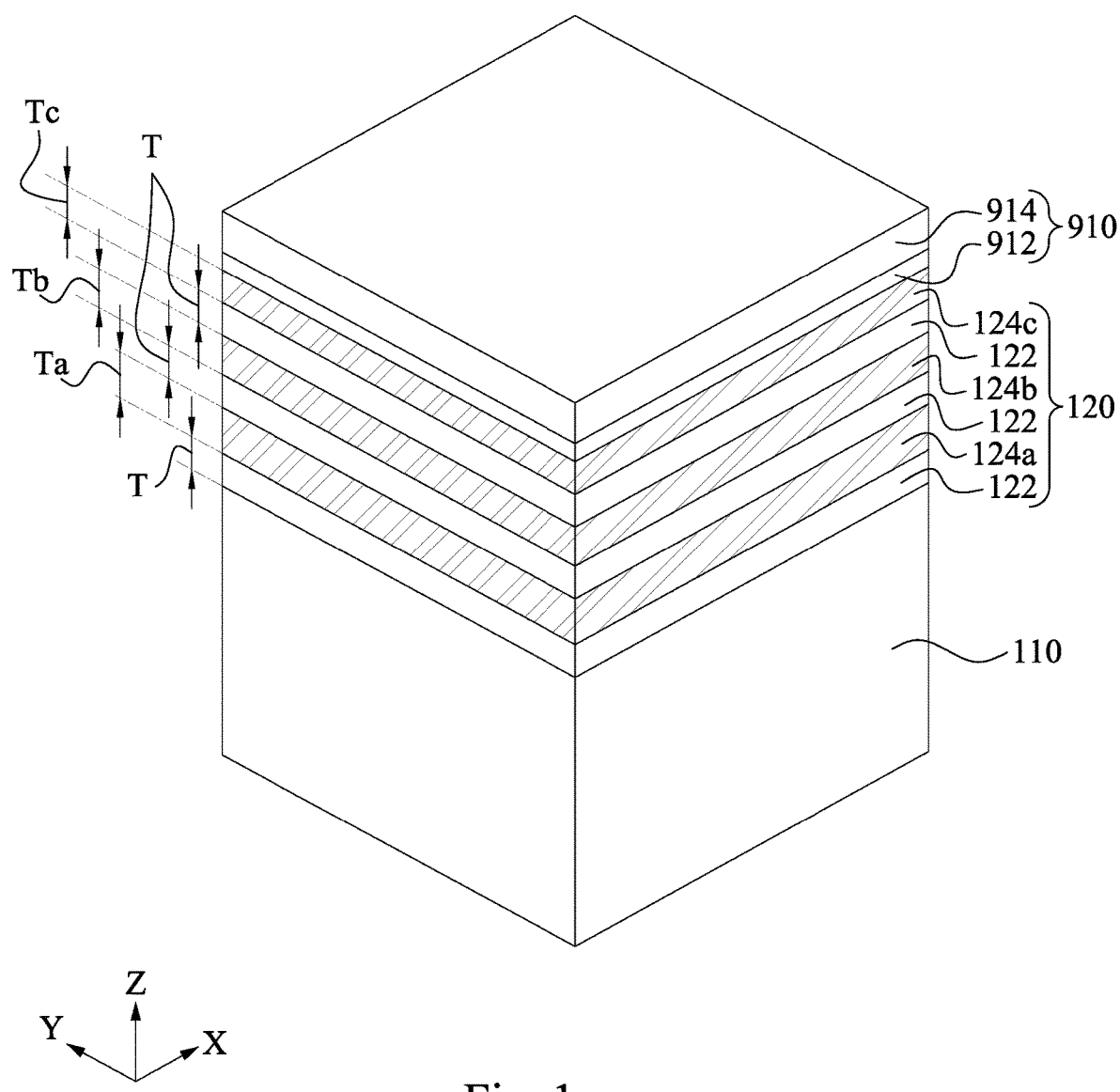
FIGS. 1-13B illustrate perspective views and cross-sectional views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit structures and methods of forming the same. More particularly, some embodiments of the present disclosure are related to GAA devices including channels with different thickness. With such configuration, the driving currents passing through different channels can be tuned.

FIGS. 1-13B illustrate perspective views and cross-sectional views of intermediate stages in the formation of an integrated circuit structure 100 in accordance with some embodiments of the present disclosure. In addition to the integrated circuit structure, FIGS. 1-4A, 5A, 6A, and 7A depict X-axis, Y-axis, and Z-axis directions. The formed transistors may include a p-type transistor (such as a p-type GAA FET) and/or an n-type transistor (such as an n-type GAA FET) in accordance with some exemplary embodiments. Throughout the various views and illustrative embodiments, like reference numbers are used to designate like elements. It is understood that additional operations can be provided before, during, and after the processes shown by FIGS. 1-13B, and some of the operations described below can be replaced or eliminated, for additional embodiments of the method. The order of the operations/processes may be interchangeable.

FIGS. 1-4A, 5A, 6A, and 7A are perspective views of some embodiments of the integrated circuit structure 100 at intermediate stages during fabrication. FIGS. 4B, 5B, 6B, 7B-11A, 12, and 13A are cross-sectional views of some embodiments of the integrated circuit structure 100 at intermediate stages during fabrication along a first cut (e.g., cut X-X in FIG. 4A), which is along a lengthwise direction of the channel and perpendicular to a top surface of the substrate. FIG. 11B is a cross-sectional view of some embodiments of the integrated circuit structure 100 at intermediate stages during fabrication along a second cut (e.g., cut Y-Y in FIG. 4A), which is in the gate region and perpendicular to the lengthwise direction of the channel. FIG. 13B is an enlarged view of area A in FIG. 13A.

Referring to FIG. 1, an epitaxial stack 120 is formed over the substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 120 includes epitaxial layers 122 of a first composition interposed by epitaxial layers 124a, 124b, and 124c of a second composition. The first and second compositions can be different. In some embodiments, the epitaxial layers 122 are SiGe and the epitaxial layers 124a, 124b, and 124c are silicon (Si). However, other embodiments are possible including those that provide for a first composition and a second composition having different oxidation rates and/or etch selectivity. In some embodiments, the epitaxial layers 122 include SiGe and where the epitaxial layers 124a, 124b, and 124c include Si, the Si oxidation rate of the epitaxial layers 124a, 124b, and 124c is less than the SiGe oxidation rate of the epitaxial layers 122.

The epitaxial layers 124a, 124b, and 124c or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124a, 124b, and 124c to define a channel or channels of a device is further discussed below.

It is noted that three layers of the epitaxial layers 122 and three layers of the epitaxial layers 124a, 124b, and 124c are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124a, 124b, and 124c is between 2 and 10.

As described in more detail below, the epitaxial layers 124a, 124b, and 124c may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124a, 124b, and 124c may also be referred to as channel layers.

By way of example, epitaxial growth of the layers of the epitaxial stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124a, 124b, and 124c include the same material as the substrate 110. In some embodiments, the epitaxially grown layers 122 and 124a, 124b, and 124c include a different material than the substrate 110. As stated above, in at least some examples, the epitaxial layers 122 include an epitaxially grown silicon germanium (SiGe) layer and the epitaxial layers 124a, 124b, and 124c include an epitaxially grown silicon (Si) layer. Alternatively, in some embodiments, either of the epitaxial layers 122 and 124a, 124b, and 124c may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124a, 124b, and 124c may be chosen based on providing differing oxidation and/or etching selectivity properties. In some embodiments, the epitaxial layers 122 and 124a, 124b, and 124c are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Each of the epitaxial layers 122 has a thickness T. The epitaxial layers 122 may have substantially constant thickness T. In some embodiments, the thickness T is in a range of about 2 nm to about 30 nm. The (bottom) epitaxial layer 124a has a thickness Ta, the (middle) epitaxial layer 124b has a thickness Tb, and the (top) epitaxial layer 124c has a thickness Tc. In some embodiments, the thickness Ta has the highest thickness value among the thicknesses Ta, Tb, and Tc, and/or the thickness Tc has the lowest thickness value among the thicknesses Ta, Tb, and Tc. For example, the thickness Ta is greater than the thickness Tb and Tc, and/or the thickness Tb is greater than the thickness Tc. In some other embodiments, the thickness Ta is greater than the thicknesses Tb and Tc, and the thickness Tb is substantially the same as the thickness Ta. In still some other embodiments, the thickness Ta is substantially the same as the thickness Tb, and the thickness Tb is greater than the thickness Tc. Also, a thickness difference between two adjacent epitaxial layers 122 is lower than a thickness difference between two adjacent epitaxial layers 124a, 124b and/or 124b, 124c. Embodiments fall within the present disclosure as long as the thickness Ta is greater than the thickness Tc.

In some embodiments, the thicknesses Ta, Tb, and Tc can be controlled by tuning a deposition time/duration of the epitaxial growth processes. For example, a deposition time/duration for depositing the epitaxial layer 124a is longer than a deposition time/duration for depositing the epitaxial layers 124b and/or 124c. As the deposition time/duration increases, the thickness of the epitaxial layer increases. On the other hand, deposition times/durations for depositing the epitaxial layers 122 are substantially the same.

Figure 2:
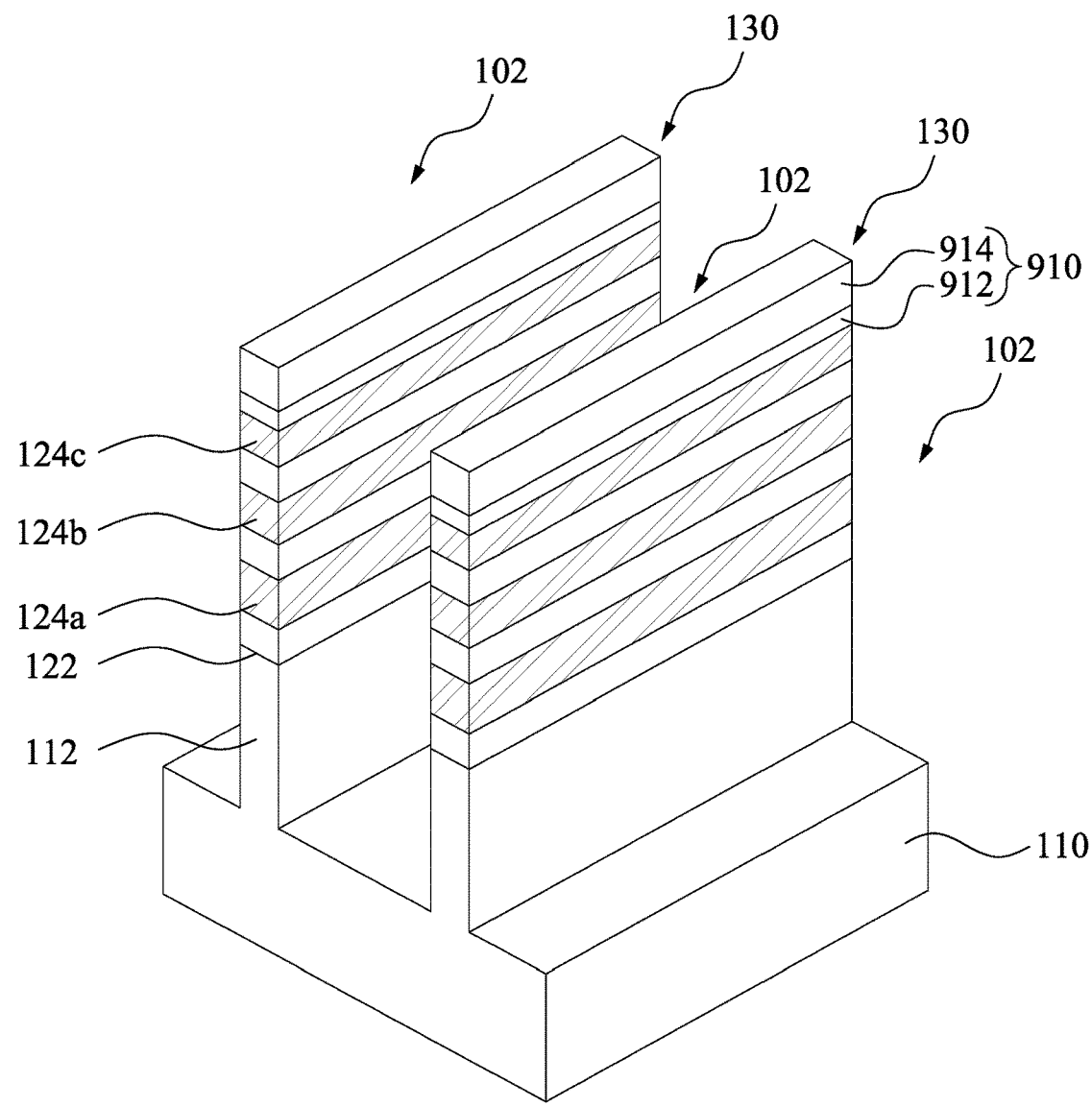

Referring to FIG. 2, a plurality of semiconductor fins 130 extending from the substrate 110 are formed. In various embodiments, each of the fins 130 includes a substrate portion 112 formed from the substrate 110 and portions of each of the epitaxial layers of the epitaxial stack including epitaxial layers 122 and 124a, 124b, and 124c. The fins 130 may be fabricated using suitable processes including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 130 by etching initial epitaxial stack 120. The etching process can include dry etching, wet etching, reactive ion etching (RIE), and/or other suitable processes.

In the illustrated embodiment as illustrated in FIGS. 1 and 2, a hard mask (HM) layer 910 is formed over the epitaxial stack 120 prior to patterning the fins 130. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 120 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 130 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 110, and layers formed thereupon, while an etch process forms trenches 102 in unprotected regions through the HM layer 910, through the epitaxial stack 120, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins 130.

Figure 3:
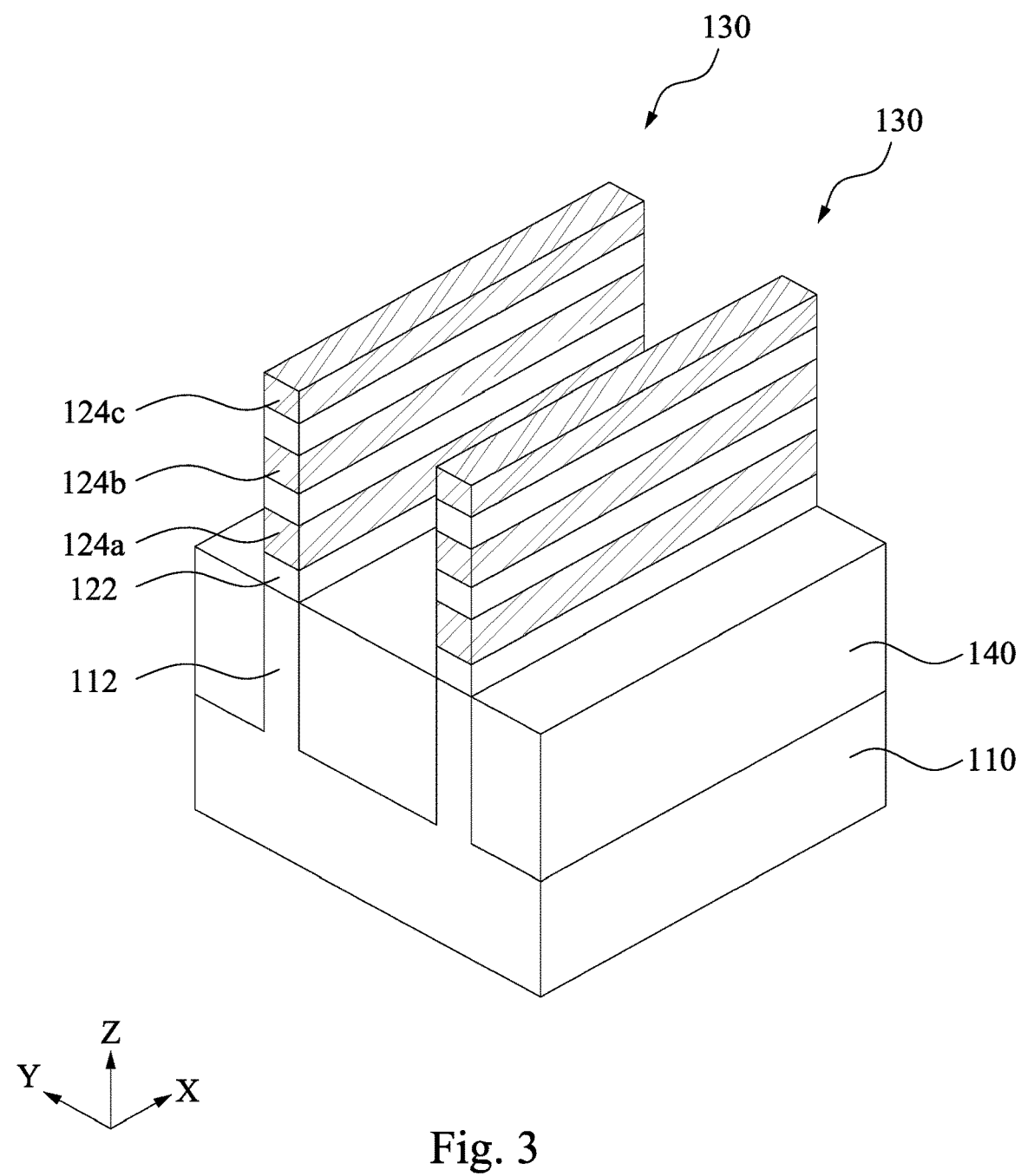

Next, as illustrated in FIG. 3, isolation regions 140 are formed interposing the fins 130. The isolation regions 140 may include a liner oxide (not shown). The liner oxide may be formed of a thermal oxide formed through a thermal oxidation of a surface layer of the substrate 110. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation regions 140 may also include a dielectric material over the liner oxide, and the dielectric material may be formed using flowable chemical vapor deposition (FCVD), spin-on coating, or the like.

The isolation regions 140 are then recessed, so that the top portions of semiconductor strips 120 protrude higher than the top surfaces of the neighboring isolation regions 140 to form protruding fins 120. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the isolation regions 140 is performed using a wet etch process. The etching chemical may include diluted HF, for example.

Figure 4A:
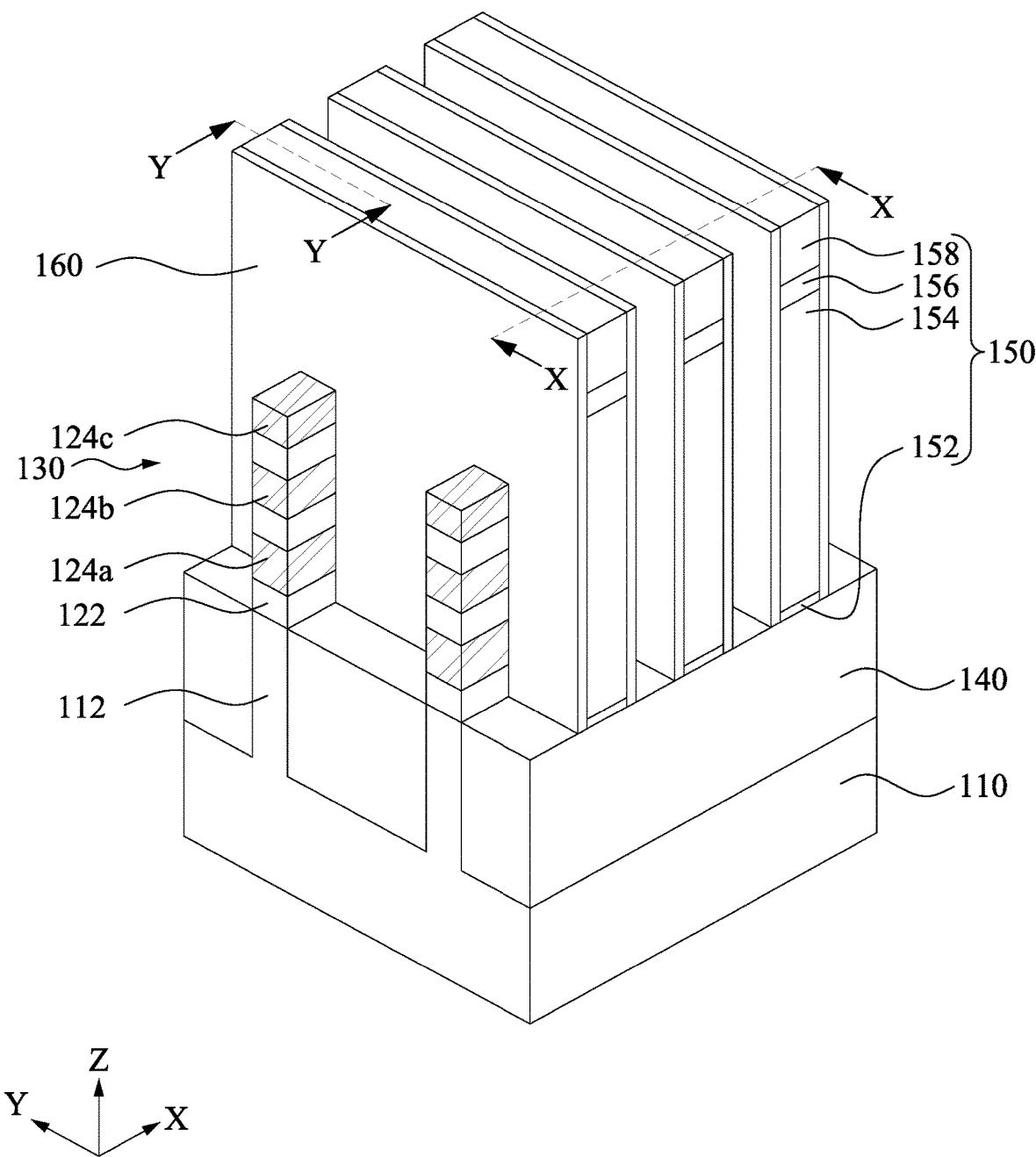
Figure 4B:
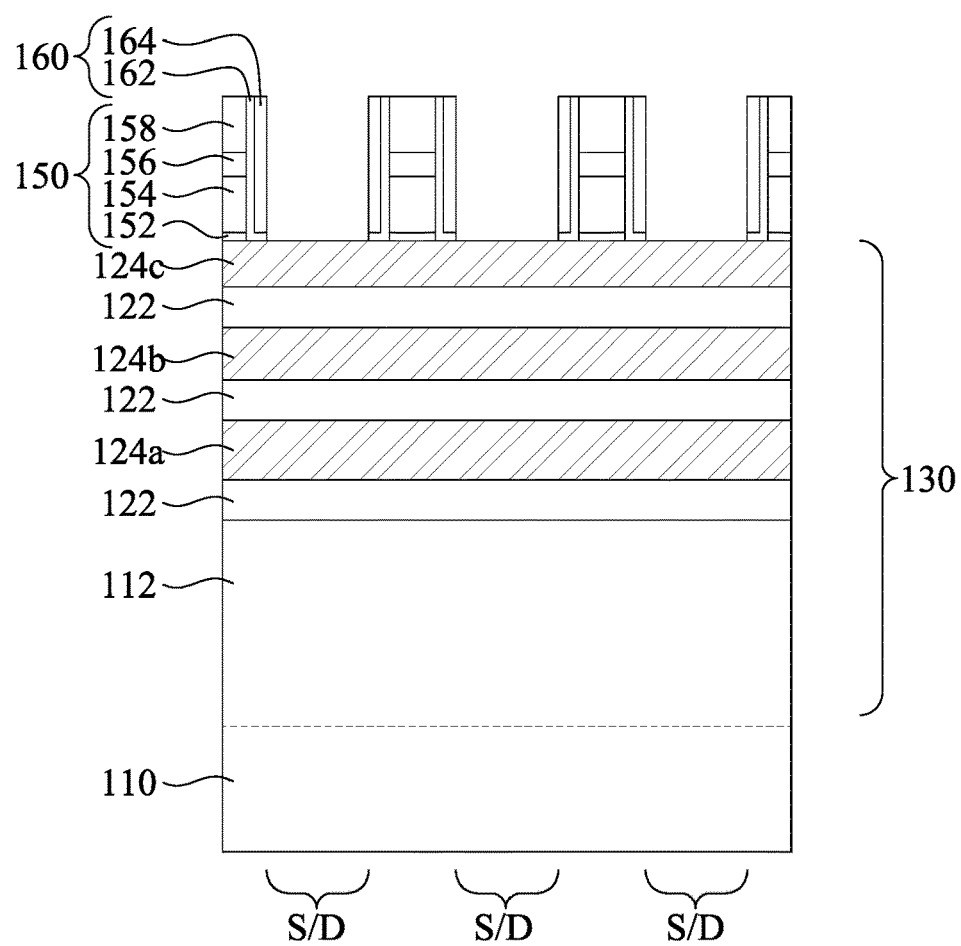

Reference is made to FIGS. 4A and 4B. Dummy gate structures 150 are formed over the substrate 110 and are at least partially disposed over the fins 130. The portions of the fins 130 underlying the dummy gate structures 150 may be referred to as the channel region. The dummy gate structures 150 may also define source/drain (S/D) regions of the fins 130, for example, the regions of the fins 130 adjacent and on opposing sides of the channel regions.

Dummy gate formation operation first forms a dummy gate dielectric layer 152 over the fins 130. Subsequently, a dummy gate electrode layer 154 and a hard mask which may include multiple layers 156 and 158 (e.g., an oxide layer 156 and a nitride layer 158) are formed over the dummy gate dielectric layer 152. The hard mask is then patterned, followed by patterning the dummy gate electrode layer 152 by using the patterned hard mask as an etch mask. In some embodiments, after patterning the dummy gate electrode layer 154, the dummy gate dielectric layer 152 is removed from the S/D regions of the fins 130. The etch process may include a wet etch, a dry etch, and/or a combination thereof. The etch process is chosen to selectively etch the dummy gate dielectric layer 152 without substantially etching the fins 130, the dummy gate electrode layer 154, the oxide mask layer 156 and the nitride mask layer 158.

The gate dielectric layers 152 can be any acceptable dielectric layer, such as silicon oxide, silicon nitride, the like, or a combination thereof, and may be formed using any acceptable process, such as thermal oxidation, a spin process, CVD, or the like. The dummy gate electrodes 154 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 150 crosses over a single one or a plurality of the fins 130. Dummy gate structures 150 may have lengthwise directions perpendicular to the lengthwise directions of the respective fins 130.

After formation of the dummy gate structures 150 is completed, gate spacers 160 are formed on sidewalls of the dummy gate structures 150. For example, a spacer material layer is deposited on the substrate 110. The spacer material layer may be a conformal layer that is subsequently etched back to form gate sidewall spacers. In the illustrated embodiment, a spacer material layer 160 is disposed conformally on top and sidewalls of the dummy gate structures 150. The spacer material layer 160 may include a dielectric material such as silicon oxide, silicon nitride, silicon carbide, silicon oxynitride, SiCN films, silicon oxycarbide, SiOCN films, and/or combinations thereof. In some embodiments, the spacer material layer 160 includes multiple layers, such as a first spacer layer 162 and a second spacer layer 164 (illustrated in FIG. 4B) formed over the first spacer layer 162. By way of example, the spacer material layer 160 may be formed by depositing a dielectric material over the gate structures 150 using suitable deposition processes. An anisotropic etching process is then performed on the deposited spacer material layer 160 to expose portions of the fins 130 not covered by the dummy gate structure 150 (e.g., in source/drain regions of the fins 130). Portions of the spacer material layer directly above the dummy gate structure 150 may be completely removed by this anisotropic etching process. Portions of the spacer material layer on sidewalls of the dummy gate structure 150 may remain, forming gate sidewall spacers, which are denoted as the gate spacers 160, for the sake of simplicity. It is noted that although the gate spacers 160 are multi-layer structures in the cross-sectional view of FIG. 4B, they are illustrated as single-layer structures in the perspective view of FIG. 4A for the sake of simplicity.

Figure 5A:
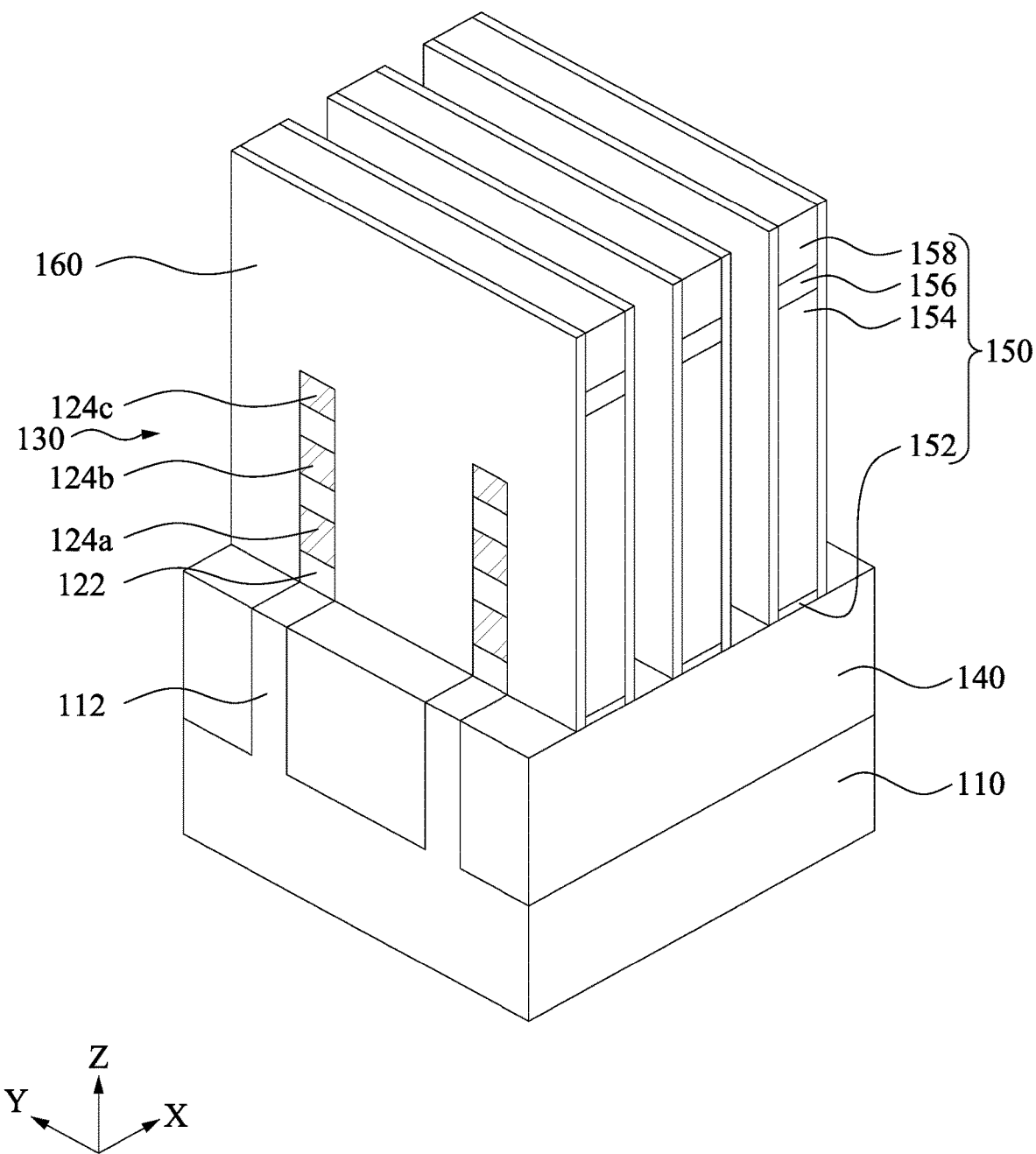
Figure 5B:
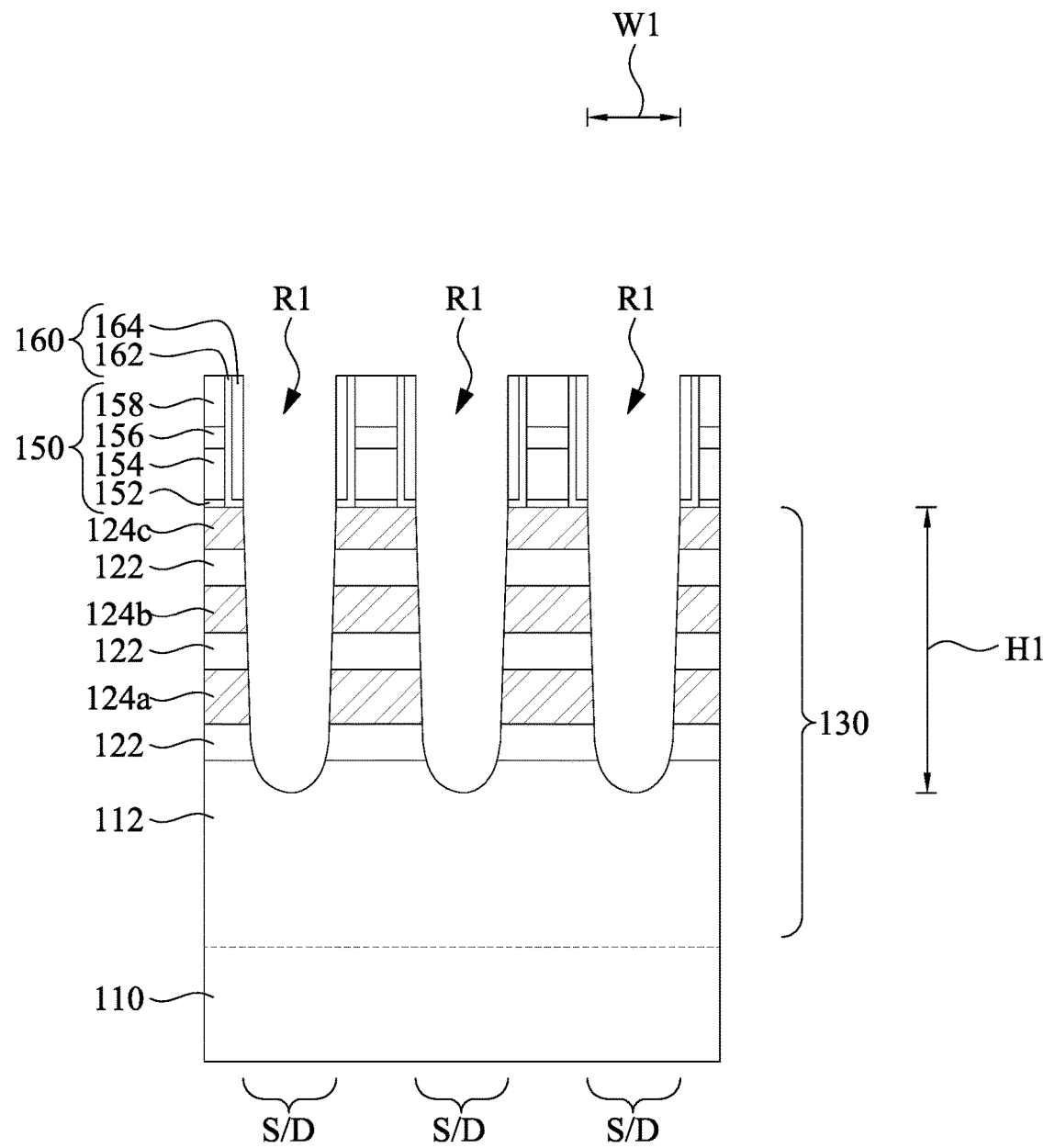

Next, as illustrated in FIGS. 5A and 5B, exposed portions of the semiconductor fins 130 that extend laterally beyond the gate spacers 160 (e.g., in source/drain regions of the fins 130) are etched by using, for example, an anisotropic etching process that uses the dummy gate structure 150 and the gate spacers 160 as an etch mask, resulting in recesses R1 into the semiconductor fins 130 and between corresponding dummy gate structures 150. After the anisotropic etching, end surfaces of the epitaxial layers 122 and channel layers 124a, 124b, and 124c and respective outermost sidewalls of the gate spacers 160 are substantially coterminous, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

In some embodiments, the recesses R1 have tapered sidewall profile due to the nature of anisotropic etching of the etching process. Therefore, the channel lengths (in the x-direction as shown in FIG. 5B) of the epitaxial layers (or referred to as channel layers) 124a, 124b, and 124c may be slightly different. For example, the channel length of the epitaxial layer 124a is longer than the channel length of the epitaxial layer 124b, which is longer than the channel length of the epitaxial layer 124c. However, in some other embodiments, the etching conditions of the etching process may be fined-tune to allow the recesses R1 having vertical sidewall profile. Further, each of the recesses R1 has a height H1 and a width W1.

Figure 6A:
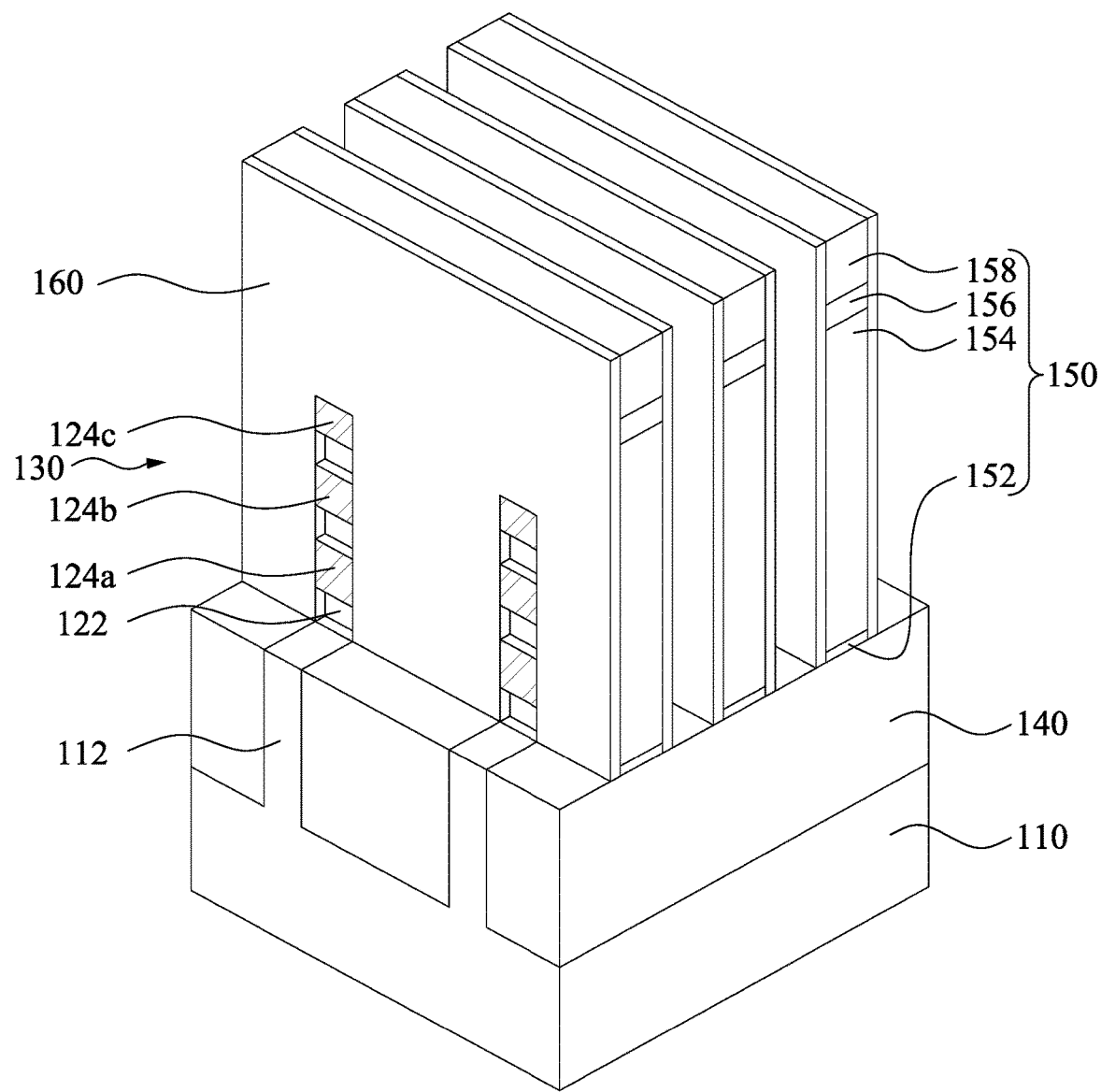
Figure 6B:
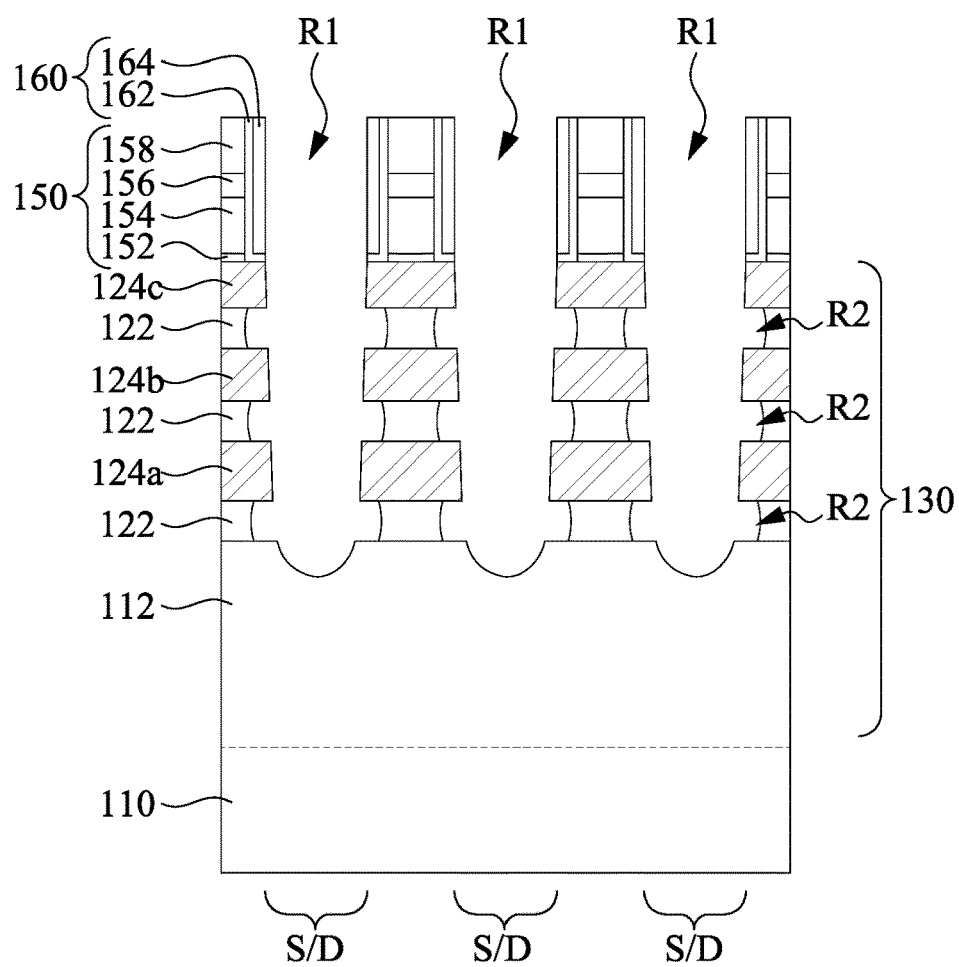

Next, in FIGS. 6A and 6B, the epitaxial layers 122 are laterally or horizontally recessed by using suitable etch techniques, resulting in lateral recesses R2 each vertically between corresponding channel layers 124a, 124b, and 124c. This operation may be performed by using a selective etching process. By way of example and not limitation, the epitaxial layers 122 are SiGe and the channel layers 124a, 124b, and 124c are silicon allowing for the selective etching of the epitaxial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124a, 124b, and 124c is not significantly etched by the process of laterally recessing the epitaxial layers 122. As a result, the channel layers 124a, 124b, and 124c laterally extend past opposite end surfaces of the epitaxial layers 122.

Figure 7A:
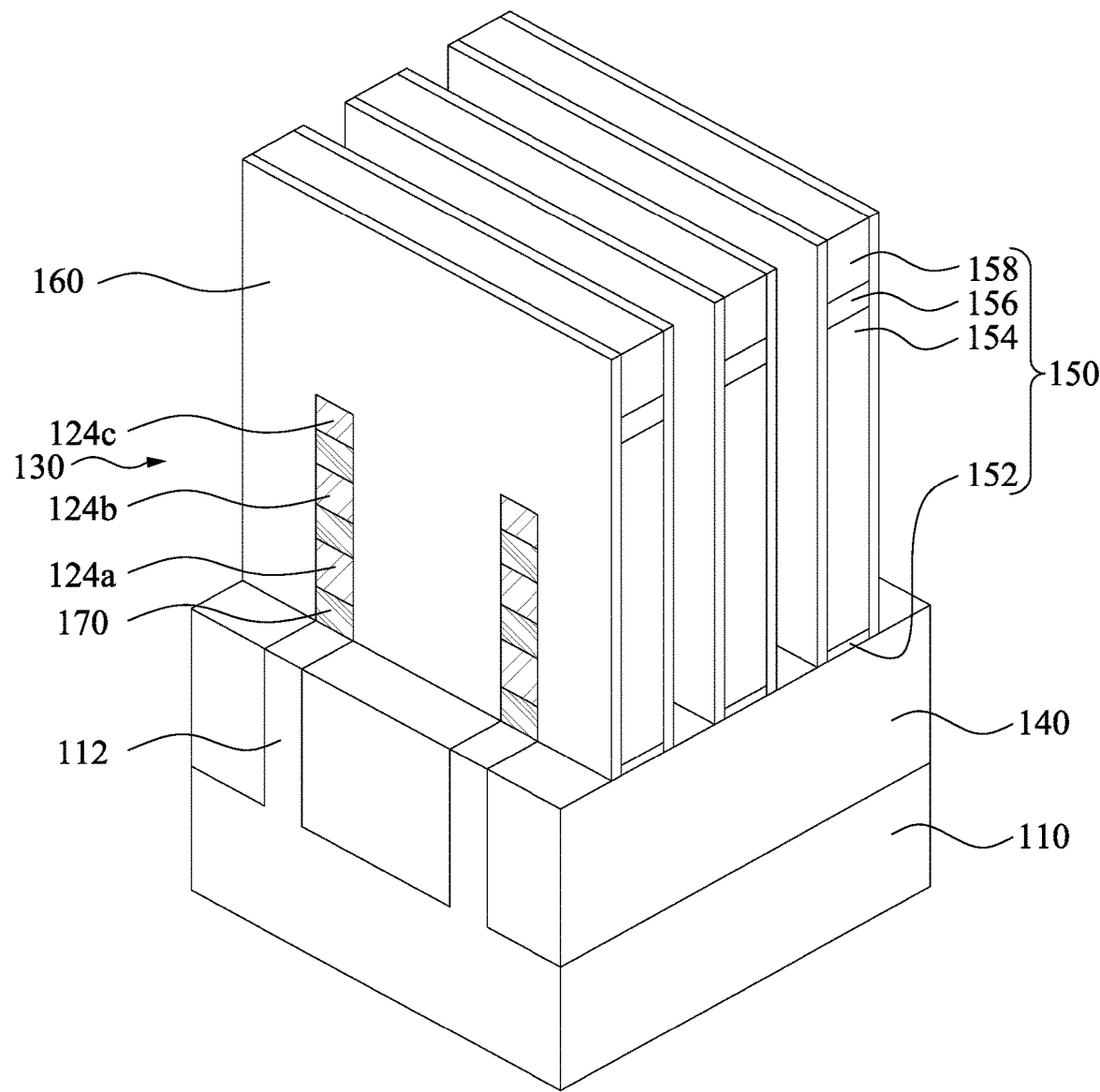
Figure 7B:
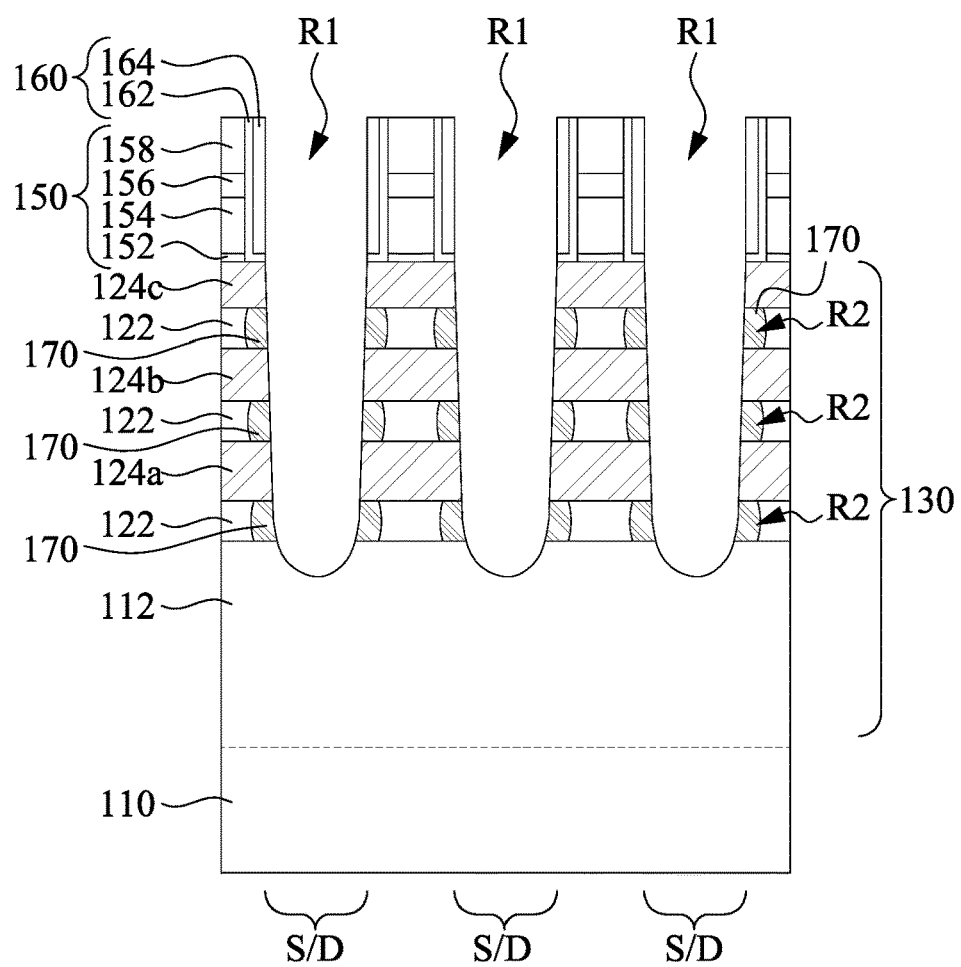

In FIGS. 7A and 7B, inner spacer material layers 170 are formed to fill the recesses R2 left by the lateral etching of the epitaxial layers 122 discussed above with reference to FIGS. 6A and 6B. The inner spacer material layer 170 may be a low-k dielectric material, such as $SiO_2$, SiN, SiCN, or SiOCN, and may be formed by a suitable deposition method, such as ALD. After the deposition of the inner spacer material layer 170, an anisotropic etching process may be performed to trim the deposited inner spacer material 170, such that only portions of the deposited inner spacer material 170 that fill the recesses R2 left by the lateral etching of the epitaxial layers 122 are left. After the trimming process, the remaining portions of the deposited inner spacer material are denoted as inner spacers 170, for the sake of simplicity. The inner spacers 170 serve to isolate metal gates from source/drain regions formed in subsequent processing. In the example of FIGS. 7A and 7B, sidewalls of the inner spacers 170 are aligned with sidewalls of the channel layers 124a, 124b, and 124c.

Figure 8:
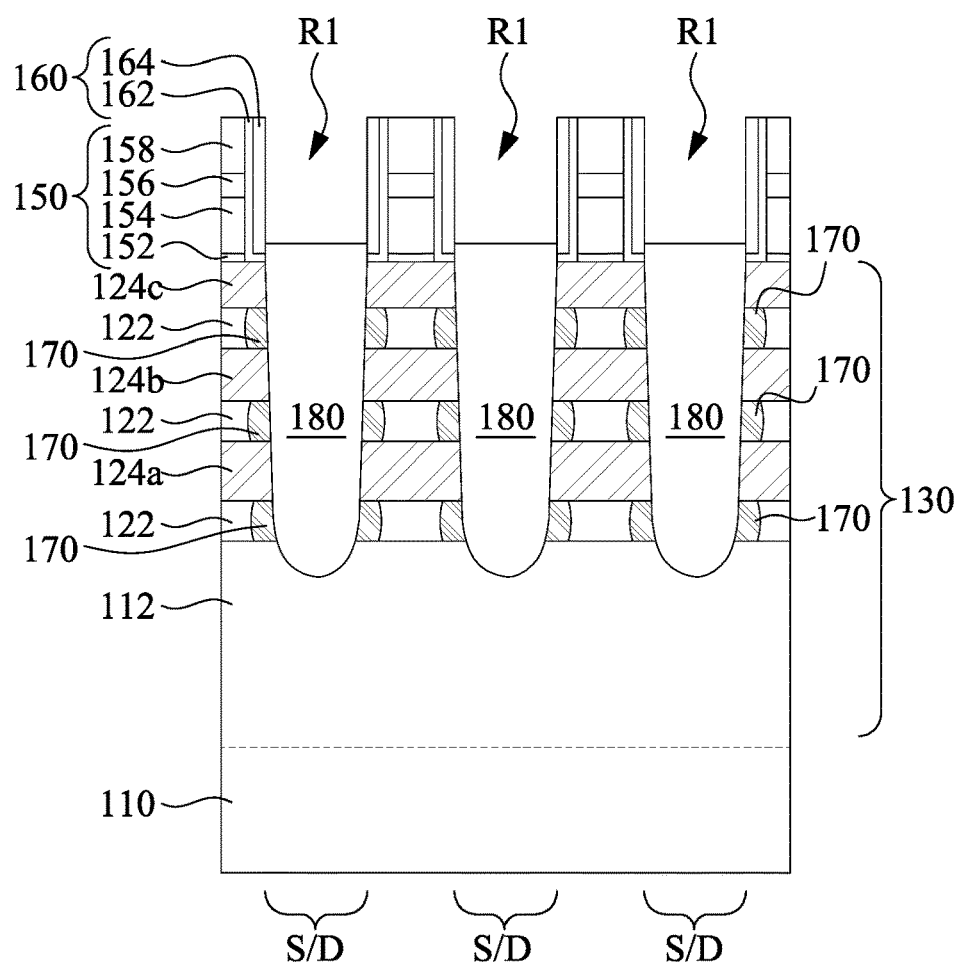

In FIG. 8, source/drain epitaxial structures 180 are formed over the source/drain regions S/D of the semiconductor fins 130. The source/drain epitaxial structures 180 may be formed by performing an epitaxial growth process that provides an epitaxial material on the fins 130. During the epitaxial growth process, the dummy gate structures 150, gate sidewall spacers 160 and the inner spacers 170 limit the source/drain epitaxial structures 180 to the source/drain regions S/D. In some embodiments, the lattice constants of the epitaxy structures 180 are different from the lattice constant of the epitaxial layers 124a, 124b, and 124c, so that the epitaxial layers 124a, 124b, and 124c can be strained or stressed by the epitaxy structures 180 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

In some embodiments, the source/drain epitaxial structures 180 may include Ge, Si, GaAs, AlGaAs, SiGe, GaAsP, SiP, or other suitable material. The source/drain epitaxial structures 180 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 180 are not in-situ doped, an implantation process (i.e., a junction implant process) is performed to dope the source/drain epitaxial structures 180. In some exemplary embodiments, the source/drain epitaxial structures 180 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed substrate portion 112 in the p-type device regions. The mask may then be removed. Subsequently, a mask, such as a photoresist, may be formed over the p-type device region while exposing the n-type device regions, and n-type epitaxial structures may be formed on the exposed substrate portion 112 in the n-type device region. The mask may then be removed.

Once the source/drain epitaxial structures 180 are formed, an annealing process can be performed to activate the p-type dopants or n-type dopants in the source/drain epitaxial structures 180. The annealing process may be, for example, a rapid thermal anneal (RTA), a laser anneal, a millisecond thermal annealing (MSA) process or the like.

Figure 9:
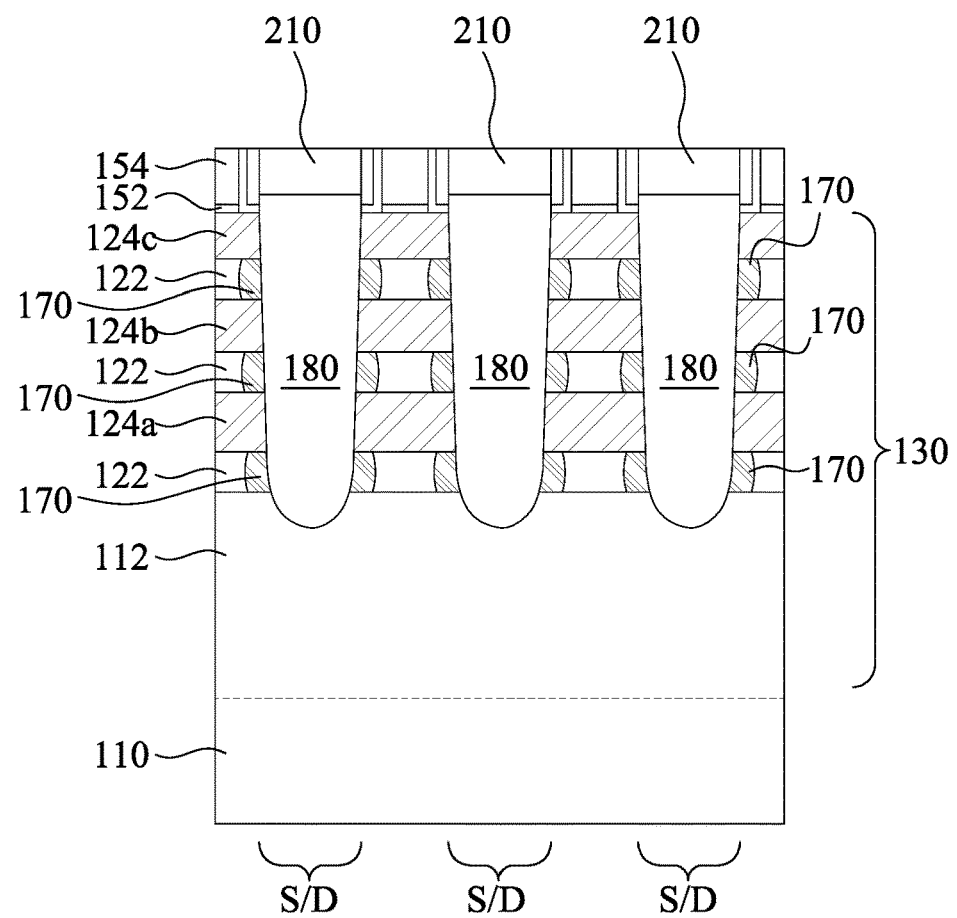
Figure 10:
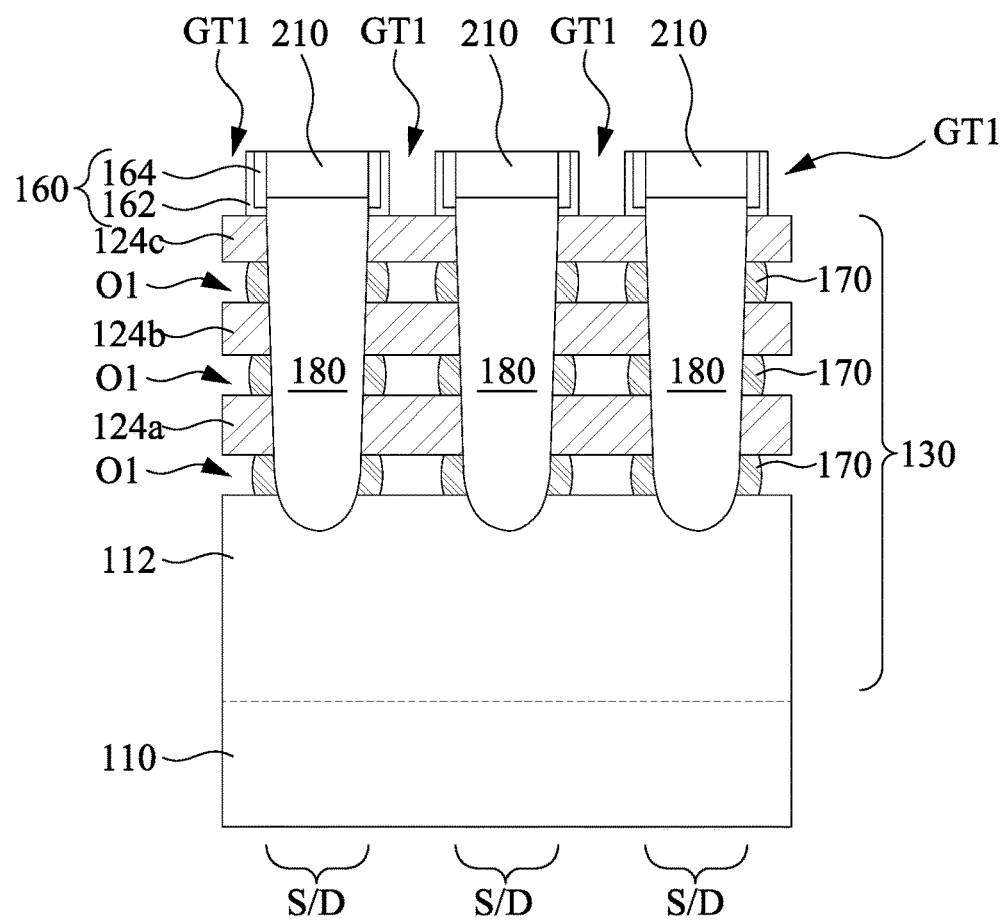

In FIG. 9, an interlayer dielectric (ILD) layer 210 is formed on the substrate 110. In some embodiments, a contact etch stop layer (CESL) is also formed prior to forming the ILD layer 210. In some examples, the CESL includes a silicon nitride layer, silicon oxide layer, a silicon oxynitride layer, and/or other suitable materials having a different etch selectivity than the ILD layer 210. The CESL may be formed by plasma-enhanced chemical vapor deposition (PECVD) process and/or other suitable deposition or oxidation processes. In some embodiments, the ILD layer 210 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer 210 may be deposited by a PECVD process or other suitable deposition technique. In some embodiments, after formation of the ILD layer 210, the wafer may be subject to a high thermal budget process to anneal the ILD layer 210.

In some examples, after depositing the ILD layer 210, a planarization process may be performed to remove excessive materials of the ILD layer 210. For example, a planarization process includes a chemical mechanical planarization (CMP) process which removes portions of the ILD layer 210 (and CESL layer, if present) overlying the dummy gate structures 150 and planarizes a top surface of the integrated circuit structure 100. In some embodiments, the CMP process also removes hard mask layers 156 and 158 (as shown in FIG. 8) and exposes the dummy gate electrode layer 154.

Thereafter, the dummy gate structures 150 (as shown in FIGS. 8 and 9) are removed first, and then the epitaxial layers (i.e., sacrificial layers) 122 (as shown in FIG. 9) are removed. The resulting structure is illustrated in FIG. 10. In some embodiments, the dummy gate structures 150 are removed by using a selective etching process (e.g., selective dry etching, selective wet etching, or a combination thereof) that etches the materials in dummy gate structures 150 at a faster etch rate than it etches other materials (e.g., gate sidewall spacers 160 and/or ILD layer 210), thus resulting in gate trenches GT1 between corresponding gate sidewall spacers 160, with the epitaxial layers 122 exposed in the gate trenches GT1. Subsequently, the epitaxial layers 122 in the gate trenches GT1 are removed by using another selective etching process that etches the epitaxial layers 122 at a faster etch rate than it etches the channel layers 124a, 124b, and 124c, thus forming openings O1 between neighboring epitaxial layers (i.e., channel layers) 124a, 124b, and 124c. In this way, the epitaxial layers 124a, 124b, and 124c become nanosheets suspended over the substrate 110 and between the source/drain epitaxial structures 180. This operation is also called a channel release process. At this interim processing operation, the openings O1 between the epitaxial layers (i.e., nanosheets) 124a, 124b, and 124c may be filled with ambient environment conditions (e.g., air, nitrogen, etc). In some embodiments, the epitaxial layers 124a, 124b, and 124c can be interchangeably referred to as nanowires, nanoslabs and nanorings, depending on their geometry. For example, in some other embodiments the epitaxial layers 124a, 124b, and 124c may be trimmed to have a substantial rounded shape (i.e., cylindrical) due to the selective etching process for completely removing the epitaxial layers 122. In that case, the resultant epitaxial layers 124a, 124b, and 124c can be called nanowires.

In some embodiments, the epitaxial layers 122 are removed by using a selective wet etching process. In some embodiments, the epitaxial layers 122 are SiGe and the epitaxial layers 124a, 124b, and 124c are silicon allowing for the selective removal of the epitaxial layers 122. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124a, 124b, and 124c may not be significantly etched by the channel release process. It can be noted that both the channel release operation and the previous operation of laterally recessing sacrificial layers (the operation as shown in FIGS. 6A and 6B) use a selective etching process that etches SiGe at a faster etch rate than etching Si, and therefore these two operations may use the same etchant chemistry in some embodiments. In this case, the etching time/duration of channel release operation is longer than the etching time/duration of the previous operation of laterally recessing sacrificial layers, so as to completely remove the sacrificial SiGe layers.

Figure 11A:
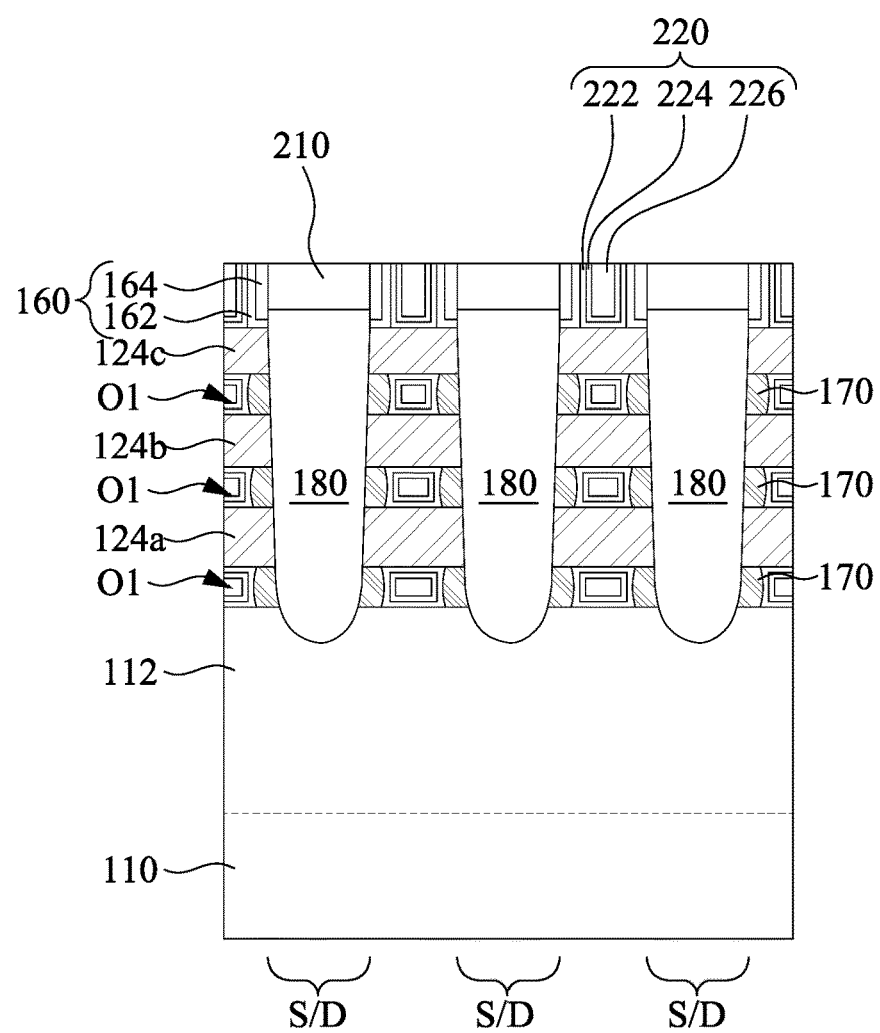
Figure 11B:
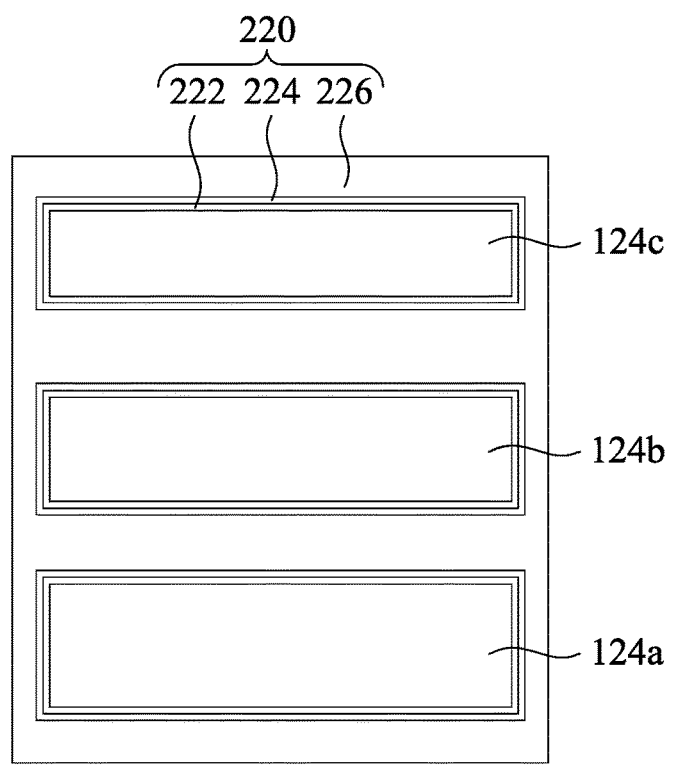

In FIGS. 11A and 11B, replacement gate structures 220 are respectively formed in the gate trenches GT1 to surround each of the epitaxial layers 124a, 124b, and 124c suspended in the gate trenches GT1. The gate structure 220 may be the final gate of a GAA FET. The final gate structure may be a high-k/metal gate stack, however other compositions are possible. In some embodiments, each of the gate structures 220 forms the gate associated with the multi-channels provided by the plurality of epitaxial layers 124a, 124b, and 124c. For example, high-k/metal gate structures 220 are formed within the openings O1 (as illustrated in FIG. 11A) provided by the release of epitaxial layers 124a, 124b, and 124c. In various embodiments, the high-k/metal gate structure 220 includes a gate dielectric layer 222 formed around the epitaxial layers 124a, 124b, and 124c, a work function metal layer 224 formed around the gate dielectric layer 222, and a fill metal 226 formed around the work function metal layer 224 and filling a remainder of gate trenches GT1. The gate dielectric layer 222 includes an interfacial layer (e.g., silicon oxide layer) and a high-k gate dielectric layer over the interfacial layer. High-k gate dielectrics include dielectric materials having a high dielectric constant, for example, greater than that of thermal silicon oxide (~3.9). The work function metal layer 224 and/or fill metal layer 226 used within high-k/metal gate structures 220 may include a metal, metal alloy, or metal silicide. Formation of the high-k/metal gate structures 220 may include depositions to form various gate materials, one or more liner layers, and one or more CMP processes to remove excessive gate materials. As illustrated in a cross-sectional view of FIG. 11B that is taken along a longitudinal axis of a high-k/metal gate structure 220, the high-k/metal gate structure 220 surrounds each of the epitaxial layers 124a, 124b, and 124c, and thus is referred to as a gate of a GAA FET.

In some embodiments, the interfacial layer of the gate dielectric layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 222 may include hafnium oxide ($HfO_2$). Alternatively, the gate dielectric layer 222 may include other high-k dielectrics, such as hafnium silicon oxide (HfSiO), hafnium silicon oxynitride (HfSiON), hafnium tantalum oxide (HMO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), silicon oxynitrides (SiON), and combinations thereof.

The work function metal layer 224 may include work function metals to provide a suitable work function for the high-k/metal gate structures 220. For an n-type FinFET, the work function metal layer 224 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 134 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 226 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 12:
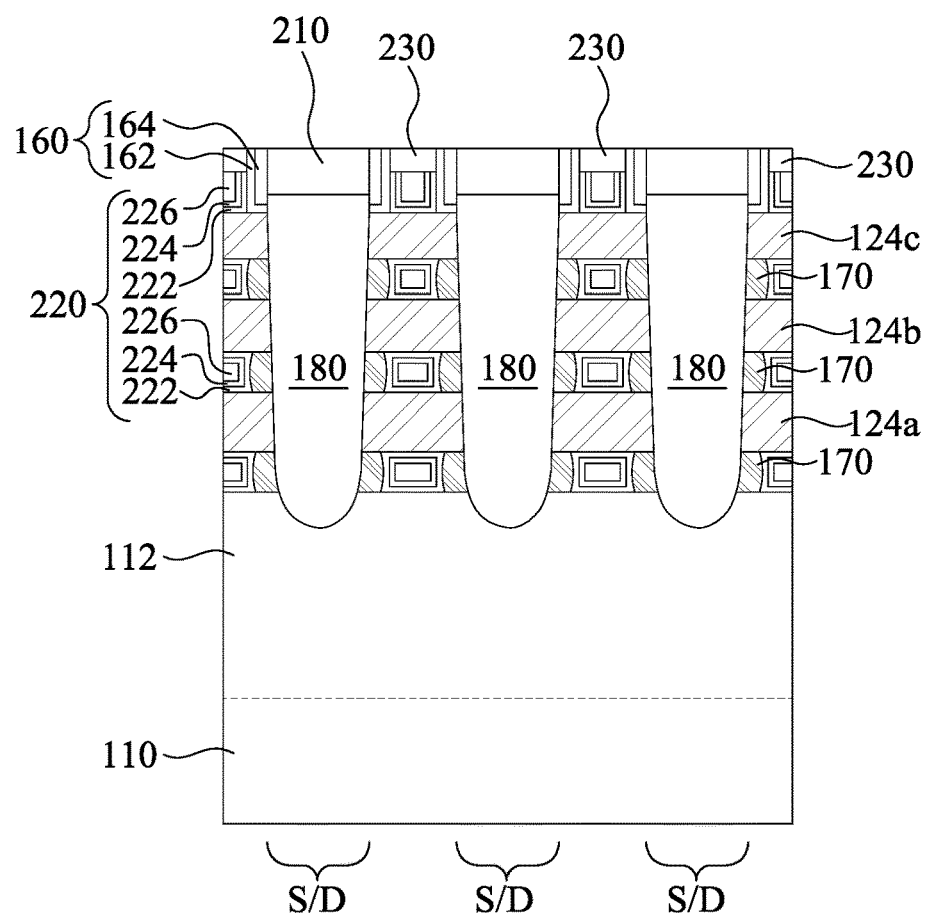

In FIG. 12, optionally, an etching back process is performed to etch back the replacement gate structures 220, resulting in recesses over the etched-back gate structures 220. In some embodiments, because the materials of the replacement gate structures 220 have a different etch selectivity than the gate spacers 160, the top surfaces of the replacement gate structures 220 may be at a lower level than the top surfaces of the gate spacers 160.

Dielectric caps 230 are optionally formed over the etched-back gate structures 220. The dielectric cap layer 230 includes $SiN_x$, $Al_xO_y$, AlON, $SiO_xC_y$, $SiC_xN_y$, combinations thereof or the like, and is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the cap layer outside the recesses, leaving portions of the dielectric cap layer in the recesses to serve as dielectric caps 230.

Figure 13A:
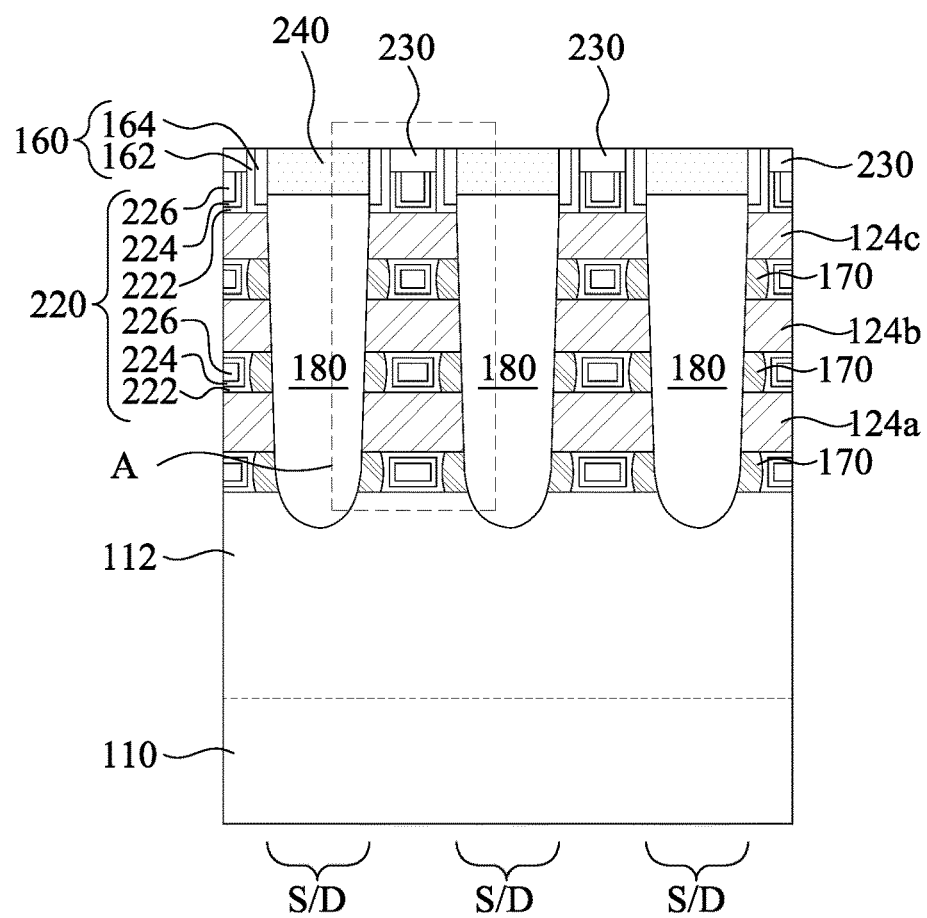
Figure 13B:
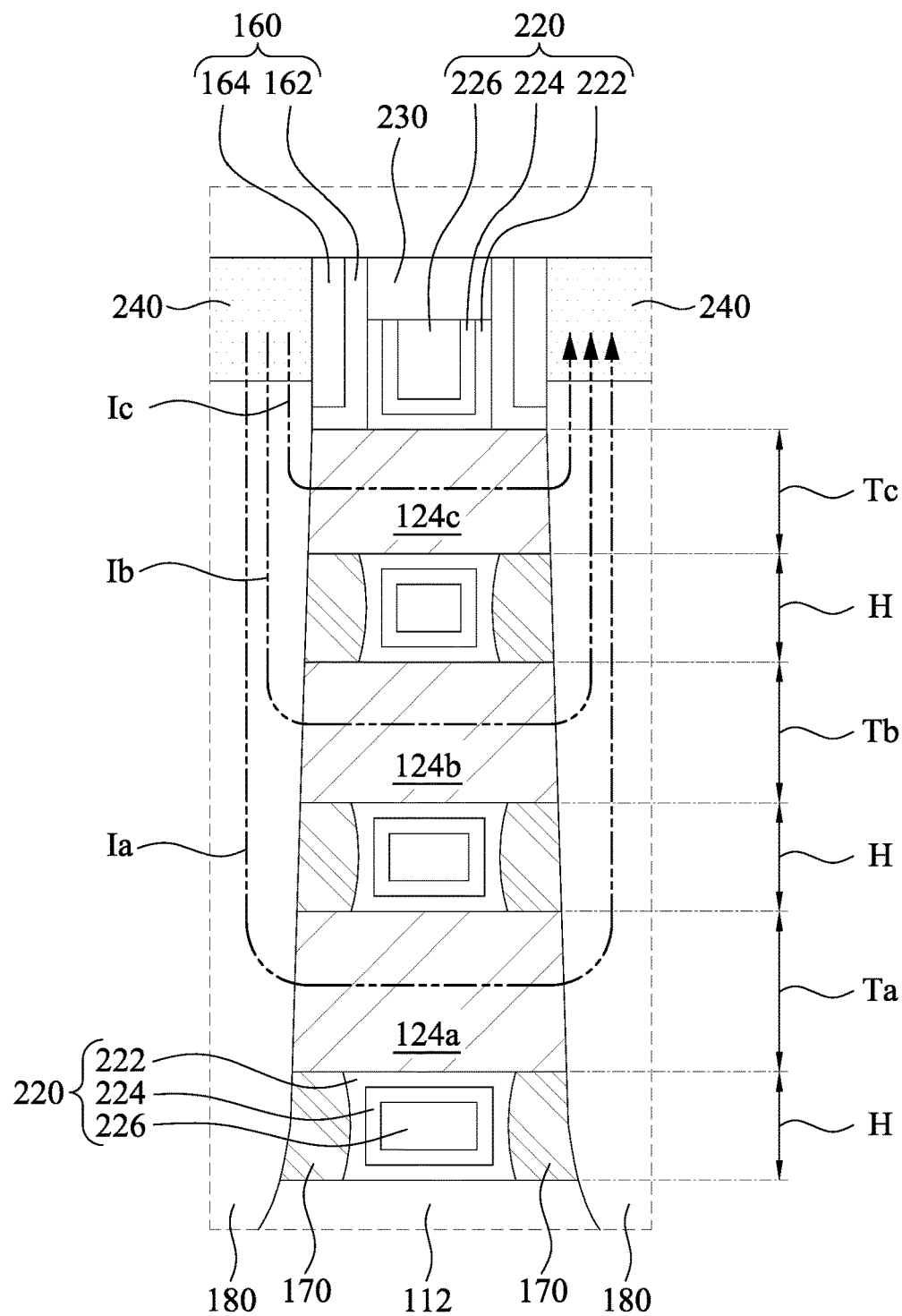

In FIG. 13A, source/drain contacts 240 are formed extending through the ILD layer 210 (and the CESL layer, if present). Formation of the source/drain contacts 240 includes, by way of example and not limitation, performing one or more etching processes to form contact openings extending though the ILD layer 210 to expose the source/drain epitaxy structures 180, depositing one or more metal materials overfilling the contact openings, and then performing a CMP process to remove excessive metal materials outside the contact openings. In some embodiments, the one or more etching processes are selective etching that etches the ILD layer 210 at a faster etch rate than etching the dielectric caps 230 and the gate spacers 160. As a result, the selective etching is performed using the dielectric caps 230 and the gate spacers 160 as an etch mask, such that the contact openings and hence the source/drain contacts 240 are formed self-aligned to the source/drain epitaxy structures 180 without using an additional photolithography process.

In that case, the dielectric caps 230 allowing for forming the self-aligned contacts 240 can be called SAC caps 230.

FIG. 13B is an enlarged view of area A in FIG. 13A. Reference is made to FIGS. 13A and 13B. The integrated circuit structure 100 includes the substrate 110, the channel layers 124a, 124b, and 124c over the substrate 110, the gate structure 220 wraps each of the channel layers 124a, 124b, and 124c, the source/drain epitaxy structures 180 connected to the channel layers 124a, 124b, and 124c, and the source/drain contacts 240 respectively over the source/drain epitaxy structures 180.

The channel layer 124c is closed to the source/drain contacts 240, and the channel layer 124a is far from the source/drain contacts 240. When a voltage is applied to one of the source/drain contacts 240 (or the source contact), paths of driving currents Ia, Ib, and Ic are formed in the integrated circuit structure 100. The driving current Ia passes through the channel layer 124a, the driving current Ib passes through the channel layer 124b, and the driving current Ic passes through the channel layer 124c. As shown in FIG. 13B, the path of the driving current Ic is shorter than the paths of the driving currents Ib and Ia. Since electrical resistance increases as the current path increases, the driving current Ic is greater than the driving currents Ib and Ia when the channel layers 124a, 124b, and 124c have the same thickness. In FIG. 13B, however, the thick channel layers 124a and/or 124b lower the electrical resistance of the channel layers 124a and/or 124b, such that the driving currents Ib and Ia can be increased.

For example, the channel layer 124a has the thickness Ta, the channel layer 124b has the thickness Tb, and the channel layer 124c has the thickness Tc. In some embodiments, the thickness Ta has the highest thickness value among the thicknesses Ta, Tb, and Tc, and/or the thickness Tc has the lowest thickness value among the thicknesses Ta, Tb, and Tc. For example, the thickness Ta is greater than the thickness Tb and Tc, and/or the thickness Tb is greater than the thickness Tc. In some other embodiments, the thickness Ta is greater than the thicknesses Tb and Tc, and the thickness Tb is substantially the same as the thickness Ta. In still some other embodiments, the thickness Ta is substantially the same as the thickness Tb, and the thickness Tb is greater than the thickness Tc. Embodiments fall within the present disclosure as long as the thickness Ta is greater than the thickness Tc.

In some embodiments, each of the thicknesses Ta, Tb, and Tc is in a range of about 2 nm to about 30 nm. If the thickness Ta (Tb, Tc) is lower than about 2 nm, the driving current Ia (Ib, Ic) may be too low; if the thickness Ta (Tb, Tc) is higher than about 30 nm, the threshold voltage of the gate to turn off the channels is too high. In some embodiments, a difference between the thicknesses Ta and Tc is greater than 0 nm and less than or equal to about 28 nm, e.g., in a range of about 1 nm to about 28 nm. If the difference between the thicknesses Ta and Tc is lower than 0 nm, the driving current Ia may be much lower than the driving current Ic; if the difference between the thicknesses Ta and Tc is greater than about 28 nm, the total height of the epitaxial stack 120 (see FIG. 1) may be too high to form low-aspect-ratio recesses R1 (see FIG. 5B). Similarly, in some embodiments, a difference between the thicknesses Ta and Tb is greater than 0 nm and less than or equal to about 28 nm, e.g., in a range of about 1 nm to about 28 nm, and/or a difference between the thicknesses Tb and Tc is greater than 0 nm and less than or equal to about 28 nm, e.g., in a range of about 1 nm to about 28 nm.

In some embodiments, spaces between adjacent channel layers (between the channel layers 124a and 124b, between the channel layers 124b and 124c, and between the channel layers 124a and the substrate portion 112) has a height H, i.e., the height of the inner spacers 170, in a range of about 2 nm to about 30 nm. If the height H is greater than about 30 nm, the aspect ratio of the recesses R1 (see FIG. 7B) may be too high; if the height H is less than about 2 nm, the gate structure 220 may not fill in the spaces between the channel layers, leaving voids therebetween.

In some embodiments, the thicknesses Ta, Tb, Tc, and T are related to the aspect ratio (defined for recesses as the ratio of the recess height H1/width W1) of the recess R1 (see FIG. 5B). In some embodiments, the aspect ratio of the recess R1 is in a range of about 1 to about 5. Once the aspect ratio and the width of the recess R1 are determined, the maximum value of the height H1 is determined, too. The sum of the thicknesses (Ta+Tb+Tc+3T) is smaller than the maximum value of the height H1.

Figure 14:
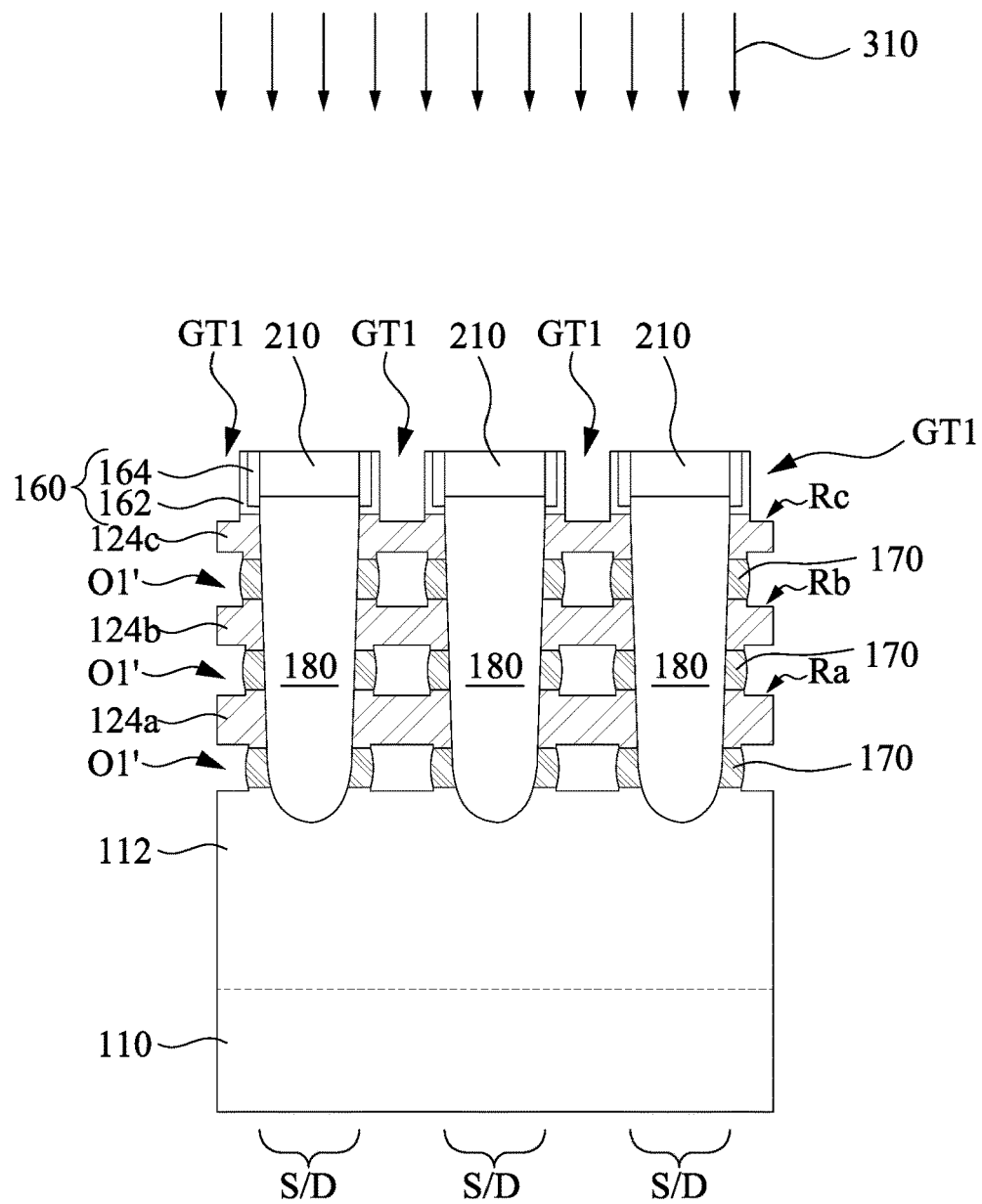
FIGS. 14-15B illustrate exemplary cross sectional views of various stages for manufacturing an integrated circuit structure according to some other embodiments of the present disclosure.
Figure 15A:
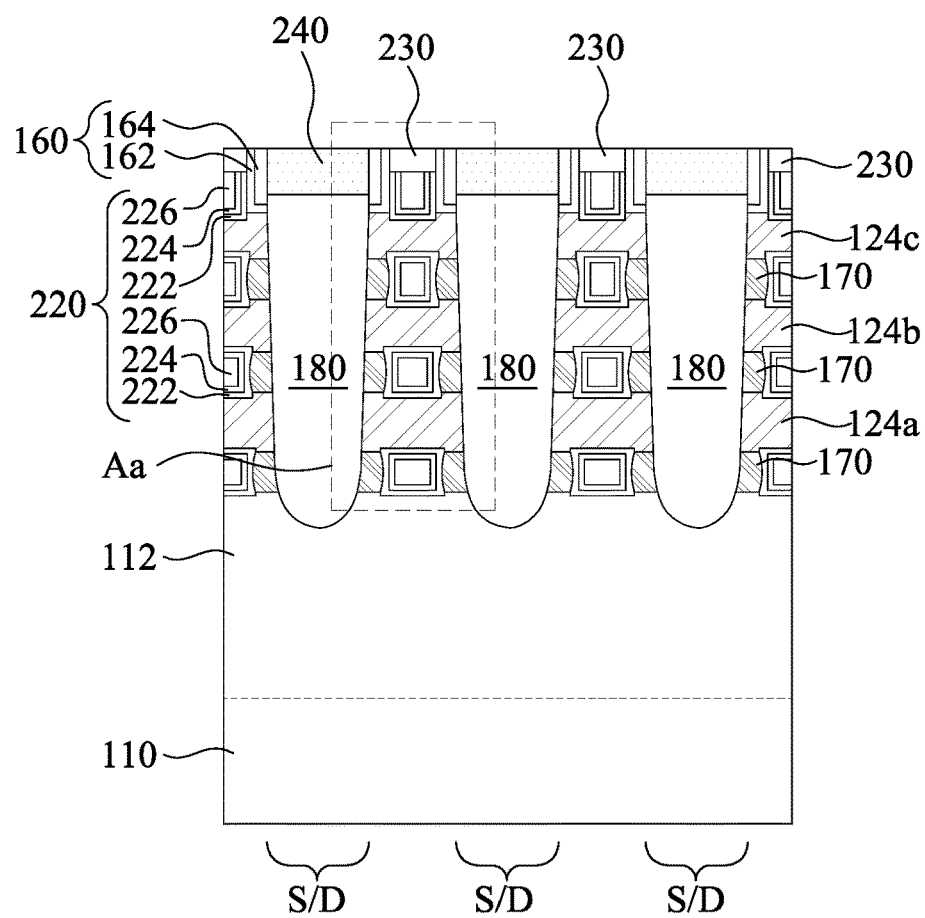
Figure 15B:
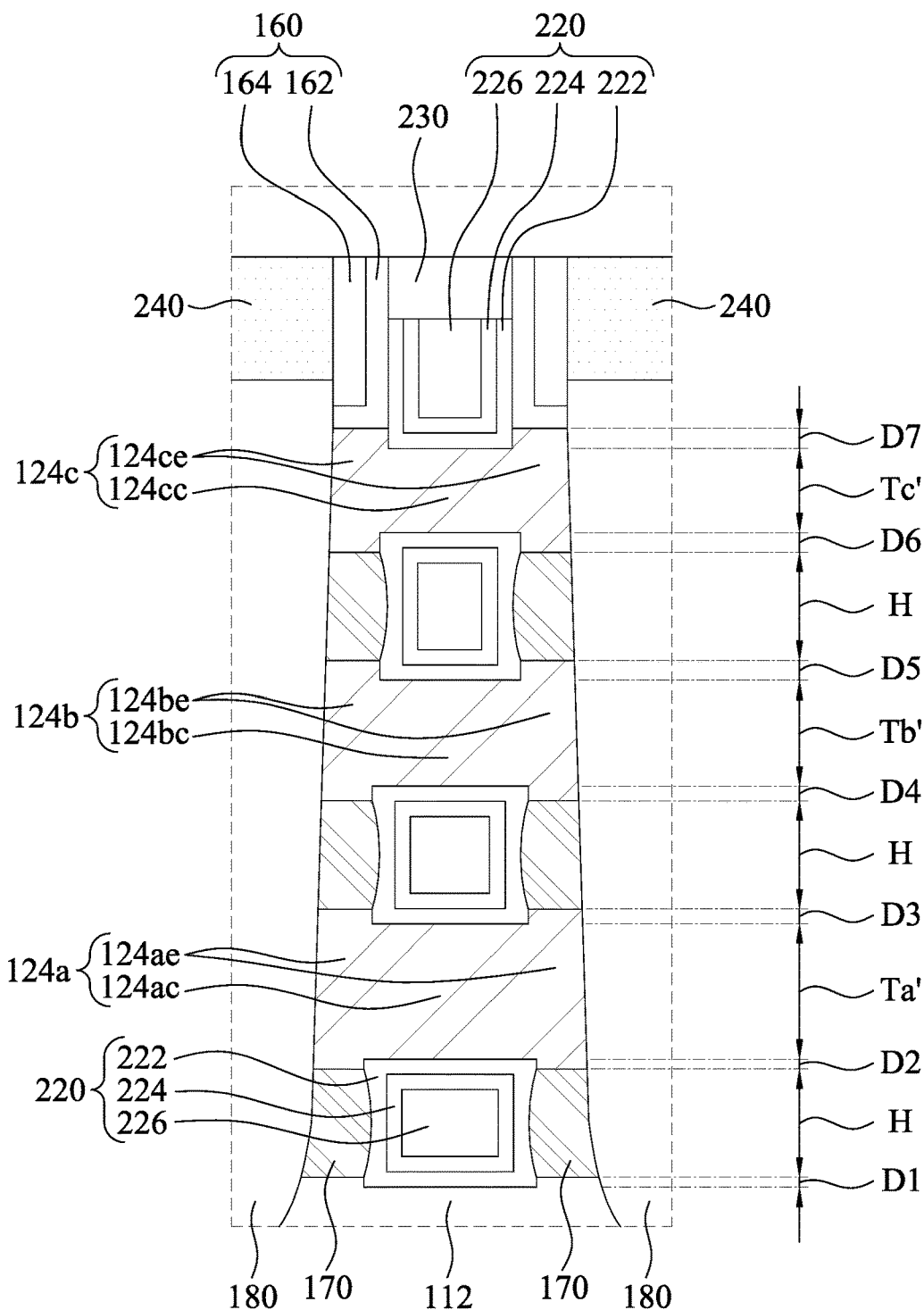

FIGS. 14-15B illustrate exemplary cross sectional views of various stages for manufacturing an integrated circuit structure 100a according to some other embodiments of the present disclosure. It is understood that additional operations can be provided before, during, and after processes shown by FIGS. 14-15B, and some of the operations described below can be replaced or eliminated, for additional embodiments of the method. The order of the operations/processes may be interchangeable. The same or similar configurations, materials, processes and/or operation as described with FIGS. 1-13B may be employed in the following embodiments, and the detailed explanation may be omitted.

After the structure as shown in FIG. 10 is formed, another etching process is performed to over-etch the channel layers 124a, 124b, and 124c, such that the openings O1 shown in FIG. 10 are enlarged to be openings O1'. In some embodiments, the channel layers 124a, 124b, and 124c are etched/recessed by an isotropic chemical etching process 310. For example, the etching may be performed by an isotropic chemical etching with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

In some embodiments, by tuning the power and/or pressure of the plasma in the etching process, the profiles of the channel layers 124a, 124b, and 124c can be tuned. For example, the higher the channel layer (e.g., the channel layer 124c), the more the etching amount of the channel layer. That is, the channel layer 124c is over-etched more severely than the channel layer 124a. In some embodiments, the etching process may be performed under a plasma source power of about 450 W to about 4800 W, and a pressure of about 20 mTorr to about 12000 mTorr, using $O_3$, $O_2$, $O_2/N_2$, $O_2/H_2$, $O_2/Ar$, and/or $O_2/He$ as etching gases. If the plasma source power is greater than about 4800 W, the channel layers 124a, 124b, and 124c may be over-etched; if the plasma source power is less than about 450 W, the etching of the channel layers 124a, 124b, and 124c may be insufficient. If the pressure is less than about 20 mTorr, the etching of the channel layers 124a, 124b, and 124c may be insufficient; if the pressure is greater than about 12000 mTorr, the channel layers 124a, 124b, and 124c may be over-etched.

Referring to FIG. 15A, after the etching process 310 in FIG. 14 is completed, the structure of FIG. 14 undergoes the processes similar to FIGS. 11A-13A. That is, gate structures 220 are formed in the gate trenches GT1 and the openings O1', the gate structures 220 are etched back, dielectric caps 230 are formed above the etched-back gate structures 220, openings are formed in the ILD 210 to expose the source/drain epitaxial structures 180, and source/drain contacts 240 are formed in the openings. Materials and fabrication process details about the aforementioned processes/elements are similar to that shown in FIGS. 11A-13A, and thus they are not repeated herein for the sake of brevity.

FIG. 15B is an enlarged view of area Aa in FIG. 15A. Reference is made to FIGS. 15A and 15B. The integrated circuit structure 100a includes the substrate 110, the channel layers 124a, 124b, and 124c over the substrate 110, the gate structure 220 wraps each of the channel layers 124a, 124b, and 124c, the source/drain epitaxy structures 180 connected to the channel layers 124a, 124b, and 124c, and the source/drain contacts 240 respectively over the source/drain epitaxy structures 180.

The channel layer 124c is closed to the source/drain contacts 240, and the channel layer 124a is far from the source/drain contacts 240. As mentioned above, the thick channel layers 124a and/or 124b lower the electrical resistance of the channel layers 124a and/or 124b, such that the driving currents passing through the channel layers 124a and/or 124b can be increased.

In some embodiments, the channel layer 124a includes a center portion 124ac and two edge portions 124ae on opposite ends of the center portion 124ac. That is, the edge portion 124ae interconnects the center portion 124ac and the source/drain epitaxial structure 180. The gate structure 220 warps the center portion 124ac, and the inner spacer material layers 170 are in contact with the edge portions 124ae. Due to the etching process 310 shown in FIG. 14, the edge portions 124ae are thicker than the center portion 124ac. The center portion 124ac has a thickness Ta', and a thickness difference, which is a sum of the depths D2 and D3 of the recesses, is between the center portion 124ac and the edge portion 124ae.

Similarly, the channel layer 124b includes a center portion 124bc and two edge portions 124be on opposite ends of the center portion 124bc. That is, the edge portion 124be interconnects the center portion 124bc and the source/drain epitaxial structure 180. The gate structure 220 warps the center portion 124bc, and the inner spacer material layers 170 are in contact with the edge portions 124be. Further, the gate dielectric layer 222 of the gate structure 220 extends from the inner sidewall of the edge portion 124ae to the inner sidewall of the edge portion 124be. Due to the etching process 310 shown in FIG. 14, the edge portions 124be are thicker than the center portion 124bc. The center portion 124bc has a thickness Tb', and a thickness difference, which is a sum of the depths D4 and D5 of the recesses, is between the center portion 124bc and the edge portion 124be.

Also, the channel layer 124c includes a center portion 124cc and two edge portions 124ce on opposite ends of the center portion 124cc. That is, the edge portion 124ce interconnects the center portion 124cc and the source/drain epitaxial structure 180. The gate structure 220 warps the center portion 124cc, and the inner spacer material layers 170 are in contact with the edge portions 124ce. Further, the gate dielectric layer 222 of the gate structure 220 extends from the inner sidewall of the edge portion 124be to the inner sidewall of the edge portion 124ce. Due to the etching process 310 shown in FIG. 14, the edge portions 124ce are thicker than the center portion 124cc. The center portion 124cc has a thickness Tc', and a thickness difference, which is a sum of the depth D6 and D7 of the recesses, is between the center portion 124cc and the edge portion 124ce. In some embodiments, the substrate portion 112 is also etched to form a recess with a depth D1 shallower than the depths D2-D7.

As mentioned above, the etching amount of the channel layers 124a, 124b, and 124c can be tuned, such that the depth D7 (D6) is greater than the depth D5 (D4), which is greater than the depth D3 (D2). Therefore, the thickness Ta' is greater than the thickness Tb', which is greater than the thickness Tc'. Other relevant structural and manufacturing details of the integrated circuit structure in FIGS. 15A-15B are substantially the same as or similar to the integrated circuit structure in FIGS. 13A-13B, and, therefore, a description in this regard will not be repeated hereinafter.

FIGS. 16-19B illustrate perspective views and cross-sectional views of intermediate stages in the formation of an integrated circuit structure 100b in accordance with some embodiments of the present disclosure. The formed transistors may include a p-type transistor (such as a p-type GAA FET) and/or an n-type transistor (such as an n-type GAA FET) in accordance with some exemplary embodiments. Throughout the various views and illustrative embodiments, like reference numbers are used to designate like elements. It is understood that additional operations can be provided before, during, and after the processes shown by FIGS. 16-19B, and some of the operations described below can be replaced or eliminated, for additional embodiments of the method. The order of the operations/processes may be interchangeable.

Figure 16:
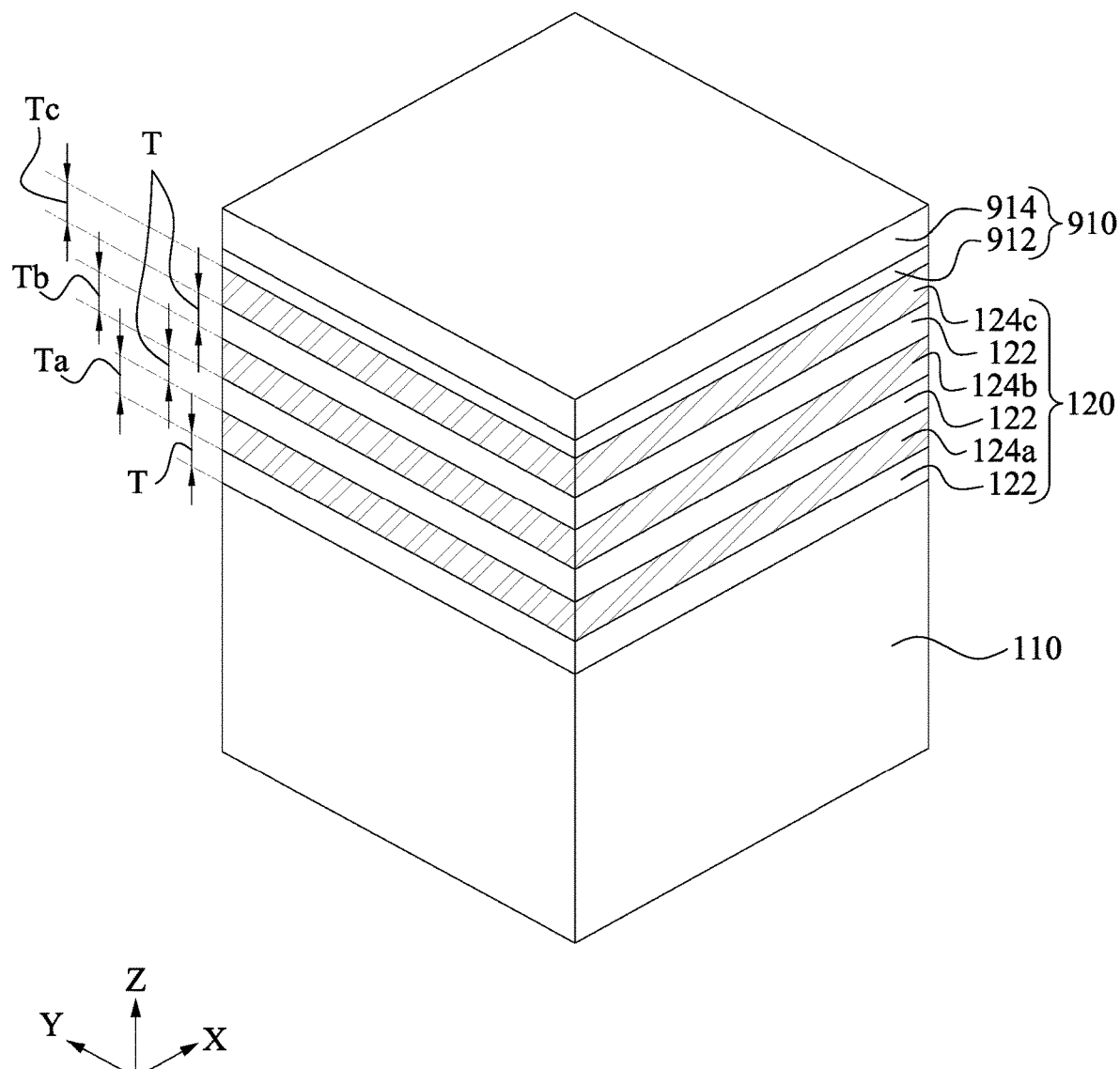
FIGS. 16-19B illustrate perspective views and cross-sectional views of intermediate stages in the formation of an integrated circuit structure in accordance with some embodiments of the present disclosure.
Figure 17A:
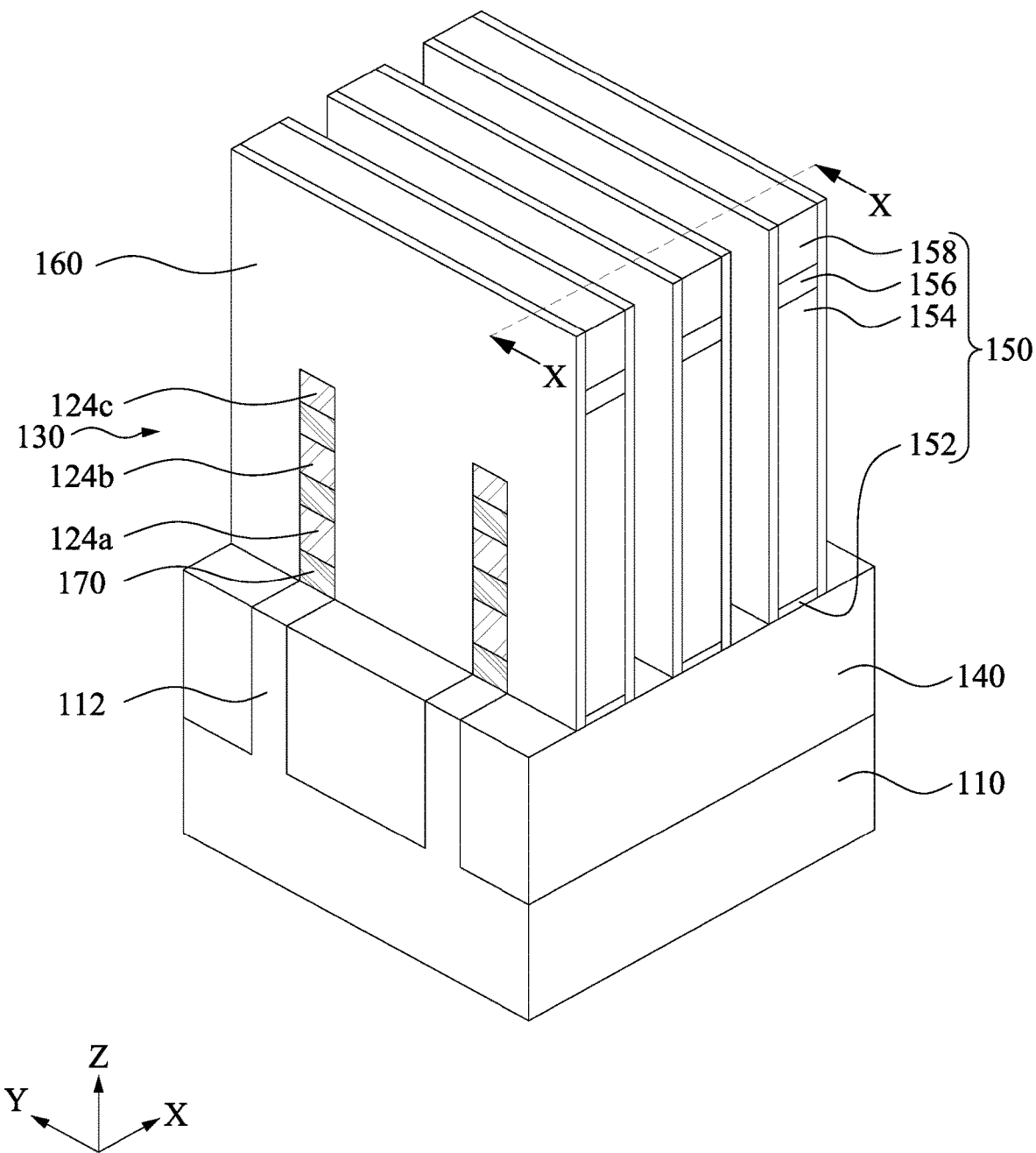
Figure 17B:
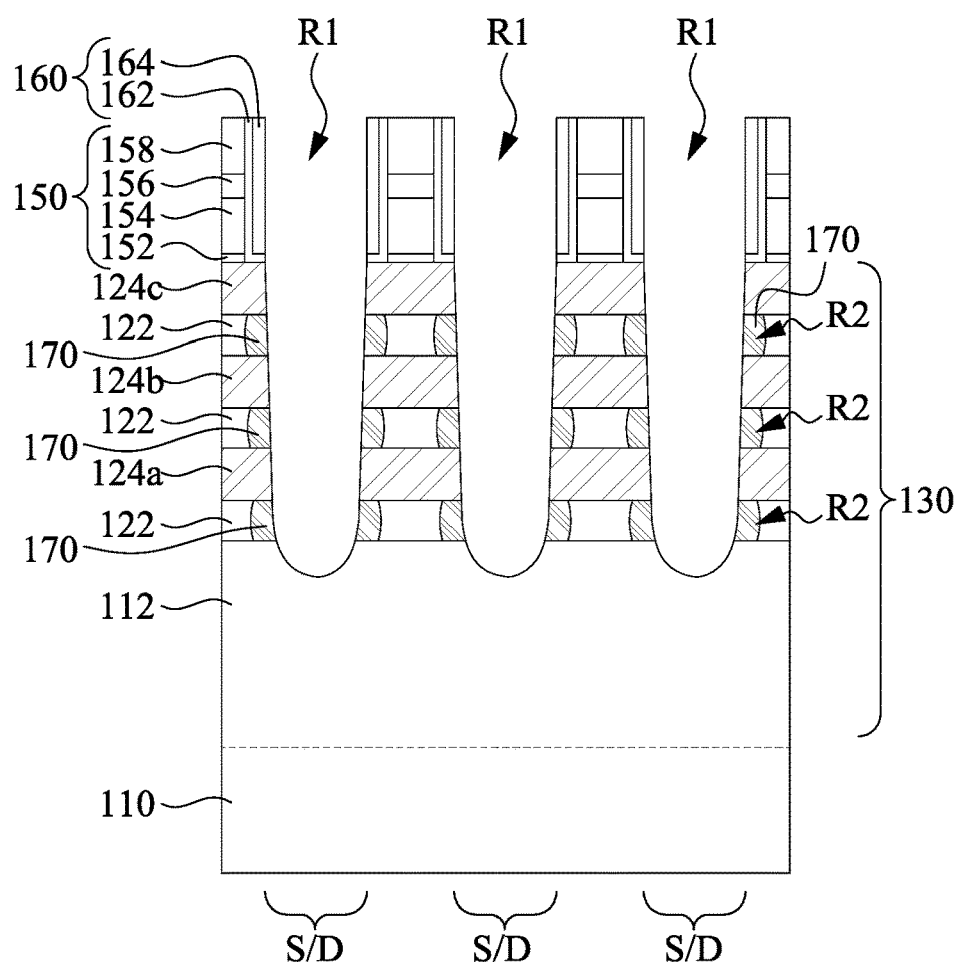
Figure 18:
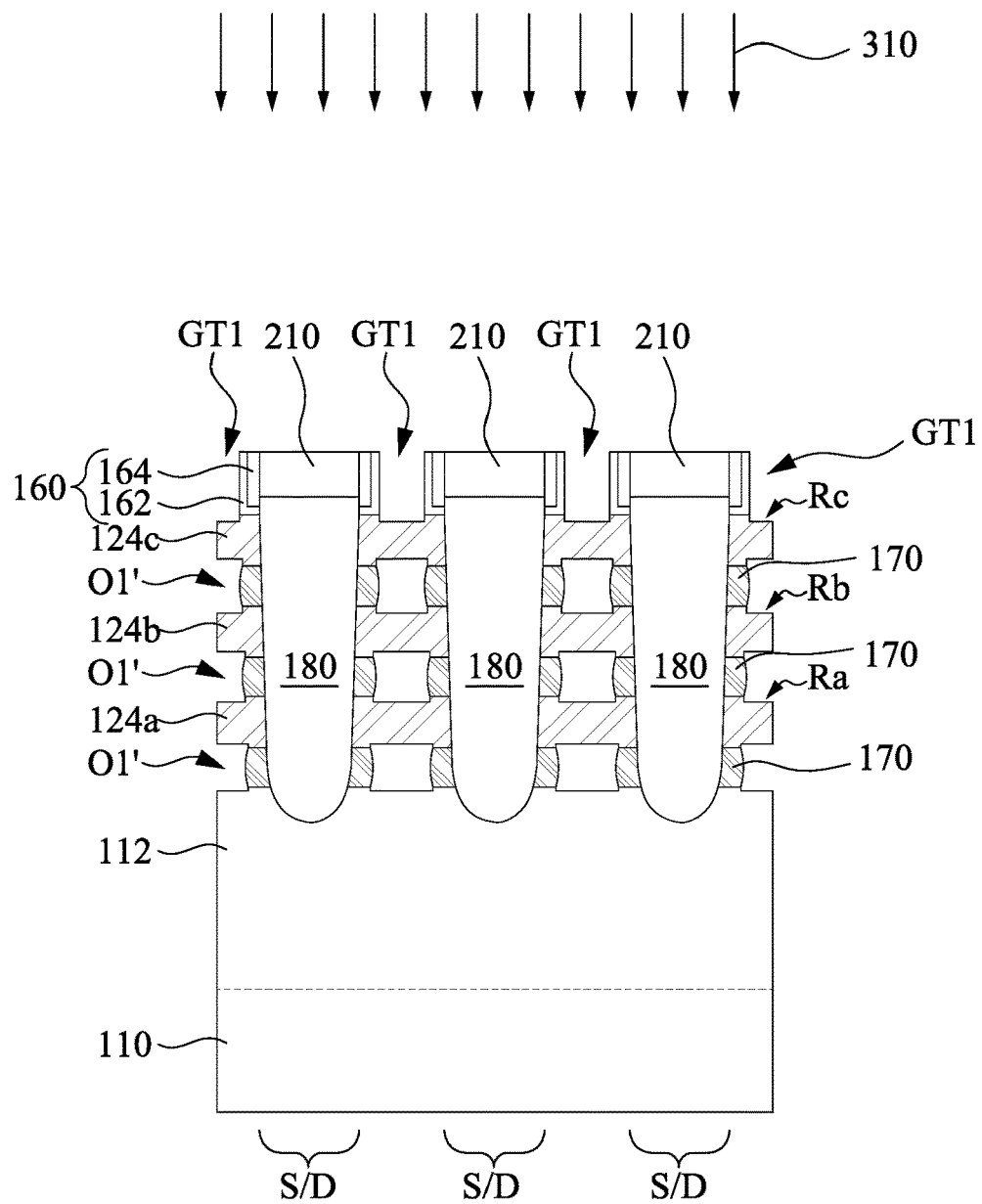
Figure 19A:
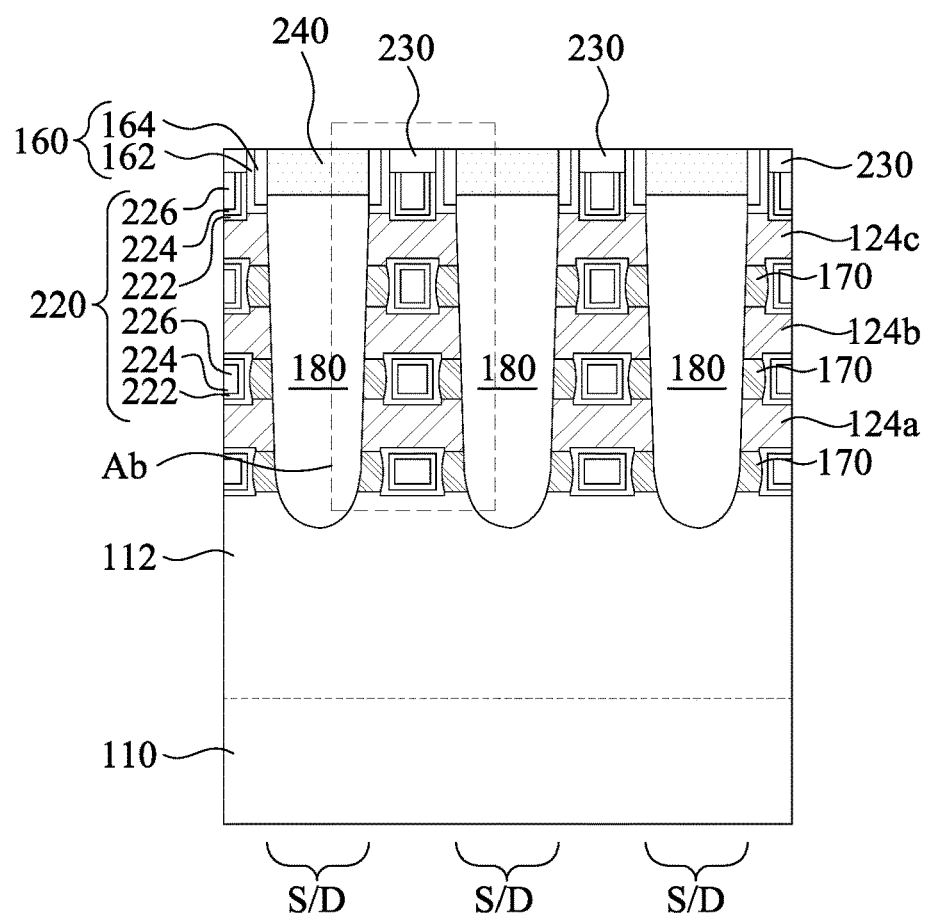
Figure 19B:
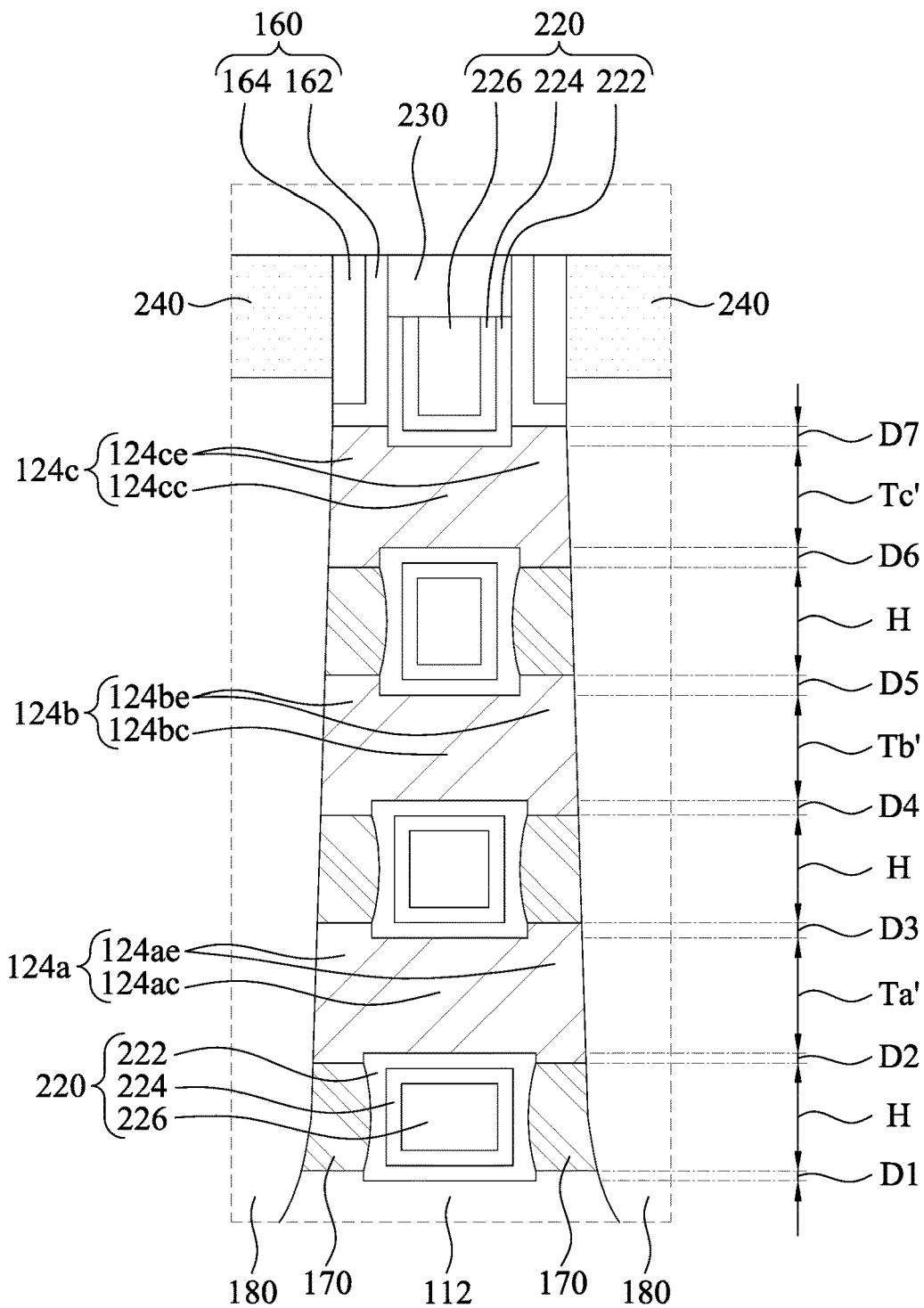

FIGS. 16 and 17A are perspective views of some embodiments of the integrated circuit structure 100b at intermediate stages during fabrication. FIGS. 17B, 18, and 19A are cross-sectional views of some embodiments of the integrated circuit structure 100b at intermediate stages during fabrication along a first cut (e.g., cut X-X in FIG. 17A), which is along a lengthwise direction of the channel and perpendicular to a top surface of the substrate. FIG. 19B is an enlarged view of area Ab in FIG. 19A.

Referring to FIG. 16, an epitaxial stack 120 is formed over the substrate 110. Materials and process details about the epitaxial stack 120 are similar to that of the epitaxial stack 120 discussed in FIG. 1, and thus they are not repeated for the sake of brevity. The (bottom) epitaxial layer 124a has a thickness Ta, the (middle) epitaxial layer 124b has a thickness Tb, and the (top) epitaxial layer 124c has a thickness Tc. In FIG. 16, the thicknesses Ta, Tb, and Tc are substantially the same. In some embodiments, each of the thicknesses Ta, Tb, and Tc is in a range of about 2 nm to about 30 nm. Similarly, each of the epitaxial layers 122 has a thickness T. The epitaxial layers 122 may have substantially constant thickness T. That is, a thickness difference between two adjacent epitaxial layers 122 is substantially the same as a thickness difference between two adjacent epitaxial layers 124a, 124b and/or 124b, 124c.

Referring to FIGS. 17A and 17B, after the deposition process in FIG. 16 is complete, the structure of FIG. 16 undergoes the processes similar to FIGS. 2-7B. That is, the epitaxial stack 120 is patterned to be semiconductor fins 130, isolation structure 140 are formed over the substrate 110, dummy gate structures 150 are formed over the substrate 110 and are at least partially disposed over the fins 130, gate spacers 160 are formed on sidewalls of the dummy gate structures 150, exposed portions of the semiconductor fins 130 that extend laterally beyond the gate spacers 160 are etched to form the recesses R1, the epitaxial layers 122 are laterally or horizontally recessed to form the recesses R2, and inner spacer material layers 170 are formed to fill the recesses R2. Materials and fabrication process details about the aforementioned processes/elements are similar to that shown in FIGS. 2 to 7B, and thus they are not repeated herein for the sake of brevity.

Referring to FIG. 18, after the inner spacer material layers 170 are formed, the structure of FIGS. 17A and 17B undergoes the process similar to FIGS. 8-10. That is, source/drain epitaxial structures 180 are formed in the recesses R1 and over the source/drain regions S/D of the semiconductor fins 130, (optional CESL and) ILD 210 is formed over the substrate 110, dummy gate structures 150 (as shown in FIG. 17A) are removed first, and then the epitaxial layers (i.e., sacrificial layers) 122 (as shown in FIG. 17B) are removed. Subsequently, another etching process is performed to over-etch the channel layers 124a, 124b, and 124c to form openings O1'.

The channel layers 124a, 124b, and 124c are then etched/recessed by an isotropic chemical etching process 310. In some embodiments, the etching may be performed by an isotropic chemical etching with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

In some embodiments, by tuning the power and/or pressure of the plasma in the etching process, the profiles of the channel layers 124a, 124b, and 124c can be tuned. For example, the higher the channel layer (e.g., the channel layer 124c), the more the etching amount of the channel layer. That is, the channel layer 124c is over-etched more severely than the channel layer 124a. In some embodiments, the etching process may be performed under a plasma source power of about 450 W to about 4800 W, and a pressure of about 20 mTorr to about 12000 mTorr, using $O_3$, $O_2$, $O_2/N_2$, $O_2/H_2$, $O_2/Ar$, and/or $O_2/He$ as etching gases. If the plasma source power is greater than about 4800 W, the channel layers 124a, 124b, and 124c may be over-etched; if the plasma source power is less than about 450 W, the etching of the channel layers 124a, 124b, and 124c may be insufficient. If the pressure is less than about 20 mTorr, the etching of the channel layers 124a, 124b, and 124c may be insufficient; if the pressure is greater than about 12000 mTorr, the channel layers 124a, 124b, and 124c may be over-etched.

Referring to FIG. 19A, after the etching process 310 in FIG. 18 is complete, the structure of FIG. 18 undergoes the processes similar to FIGS. 11A-13A. That is, gate structures 220 are formed in the gate trenches GT1 and the openings O1', the gate structures 220 are etched back, dielectric caps 230 are formed above the etched-back gate structures 220, openings are formed in the ILD 210 to expose the source/drain epitaxial structures 180, and source/drain contacts 240 are formed in the openings. Materials and fabrication process details about the aforementioned processes/elements are similar to that shown in FIGS. 11A-13A, and thus they are not repeated herein for the sake of brevity.

FIG. 19B is an enlarged view of area Ab in FIG. 19A. Reference is made to FIGS. 19A and 19B. The integrated circuit structure 100b includes the substrate 110, the channel layers 124a, 124b, and 124c over the substrate 110, the gate structure 220 wraps each of the channel layers 124a, 124b, and 124c, the source/drain epitaxy structures 180 connected to the channel layers 124a, 124b, and 124c, and the source/drain contacts 240 respectively over the source/drain epitaxy structures 180.

The channel layer 124c is closed to the source/drain contacts 240, and the channel layer 124a is far from the source/drain contacts 240. As mentioned above, the thick channel layers 124a and/or 124b lower the electrical resistance of the channel layers 124a and/or 124b, such that the driving currents passing through the channel layers 124a and/or 124b can be increased.

In some embodiments, the channel layer 124a includes a center portion 124ac and two edge portions 124ae on opposite ends of the center portion 124ac. The edge portions 124ae are thicker than the center portion 124ac. The center portion 124ac has a thickness Ta', and a thickness difference, which is a sum of the depths D2 and D3 of the recesses, is between the center portion 124ac and the edge portion 124ae. Similarly, the channel layer 124b includes a center portion 124bc and two edge portions 124be on opposite ends of the center portion 124ac. The edge portions 124be are thicker than the center portion 124bc. The center portion 124bc has a thickness Tb', and a thickness difference, which is a sum of the depths D4 and D5 of the recesses, is between the center portion 124bc and the edge portion 124be. Also, the channel layer 124c includes a center portion 124cc and two edge portions 124ce on opposite ends of the center portion 124cc. The edge portions 124ce are thicker than the center portion 124cc. The center portion 124cc has a thickness Tc', and a thickness difference, which is a sum of the depths D6 and D7 of the recesses, is between the center portion 124cc and the edge portion 124ce. In some embodiments, the substrate portion 112 is also etched to form a recess with a depth D1 shallower than the depths D2-D7.

As mentioned above, the etching amount of the channel layers 124a, 124b, and 124c can be tuned, such that the depth D7 (D6) is greater than the depth D5 (D4), which is greater than the depth D3 (D2). Therefore, the thickness Ta' is greater than the thickness Tb', which is greater than the thickness Tc'. Other relevant structural and manufacturing details of the integrated circuit structure in FIGS. 19A-19B are substantially the same as or similar to the integrated circuit structure in FIGS. 13A-13B and 15A-15B, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the channel layers with different thicknesses can improve the driving currents of the integrated circuit structures. Another advantage is that the thicknesses of the channel layers can be determined when depositing the channel layer. Yet another advantage is that an over-etching process can be added to further fine tune the thicknesses of the channel layers. Further, the thicknesses can be determined according to different applications.

According to some embodiments, a device includes a first channel layer, a second channel layer, a gate structure, a source/drain epitaxial structure, and a source/drain contact. The first channel layer and the second channel layer are arranged above the first channel layer in a spaced apart manner over a substrate. The gate structure surrounds the first and second channel layers. The source/drain epitaxial structure is connected to the first and second channel layers. The source/drain contact is connected to the source/drain epitaxial structure. The second channel layer is closer to the source/drain contact than the first channel layer is to the source/drain contact, and the first channel layer is thicker than the second channel layer.

According to some embodiments, a method includes forming an epitaxial stack over a substrate. The epitaxial stack includes a first sacrificial layer, a first channel layer, a second sacrificial layer, and a second channel layer sequentially over the substrate. A thickness of the first channel layer is greater than a thickness of the second channel layer. The epitaxial stack is patterned to be a fin structure. A dummy gate structure is formed across the fin structure such that the dummy gate structure covers a first portion of the fin structure while second portions of the fin structure are exposed. The exposed second portions of the fin structure are removed. Source/drain epitaxial structures are formed on opposite end surfaces of the first and second channel layers in the first portion of the fin structure. The dummy gate structure is removed to expose the first portion of the fin structure. The first and second sacrificial layers in the exposed first portion of the fin structure are removed while leaving the first and second channel layers in the exposed first portion of the fin structure suspended above the substrate. A gate structure is formed to surround each of the suspended first and second channel layers.

According to some embodiments, a method includes forming an epitaxial stack over a substrate. The epitaxial stack comprises a first sacrificial layer, a first channel layer, a second sacrificial layer, and a second channel layer sequentially over the substrate. The epitaxial stack is patterned into a fin structure extending along a first direction. A dummy gate structure is formed to extend across the fin structure along a second direction substantially perpendicular to the first direction. Gate spacers are respectively on opposite sides of the dummy gate structure. The dummy gate structure is removed to form a gate trench between the gate spacers. The first and second sacrificial layers are selectively removed from the gate trench while leaving the first and second channel layers suspended in the gate trench. After selectively removing the first and second sacrificial layers, recesses are respectively formed in the first and second channel layers. A depth of the recess in the second channel layer is greater than a depth of the recess in the first channel layer. After forming the recesses respectively in the first and second channel layers, a gate structure is formed in the gate trench and the recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an epitaxial stack over a substrate, wherein the epitaxial stack comprises a first sacrificial layer, a first channel layer, a second sacrificial layer, and a second channel layer sequentially over the substrate, and a thickness of the first channel layer is greater than a thickness of the second channel layer;

patterning the epitaxial stack to be a fin structure;
forming a dummy gate structure across the fin structure such that the dummy gate structure covers a first portion of the fin structure while second portions of the fin structure are exposed;
removing the exposed second portions of the fin structure;
forming source/drain epitaxial structures on opposite end surfaces of the first and second channel layers in the first portion of the fin structure;
removing the dummy gate structure to expose the first portion of the fin structure;
removing the first and second sacrificial layers in the exposed first portion of the fin structure while leaving the first and second channel layers in the exposed first portion of the fin structure suspended above the substrate;
after removing the first and second sacrificial layers, forming recesses respectively in the first and second channel layers, wherein a depth of the recess in the second channel layer is greater than a depth of the recess in the first channel layer; and
after forming the recesses respectively in the first and second channel layers, forming a gate structure in the recesses to surround each of the suspended first and second channel layers.

2. The method of claim 1, wherein a thickness difference between the thickness of the first channel layer and the thickness of the second channel layer is greater than 0 nm and less than or equal to about 28 nm.

3. The method of claim 1, wherein forming the epitaxial stack comprises forming the first channel layer with a first deposition duration and forming the second channel layer with a second deposition duration shorter than the first deposition duration.

4. The method of claim 1, wherein forming the epitaxial stack comprises forming the first sacrificial layer with a first deposition duration and forming the second sacrificial layer with a second deposition duration substantially the same as the first deposition duration.

5. The method of claim 1, wherein removing the exposed second portions of the fin structure is such that a length of the first portion of the first channel layer is greater than a length of the first portion of the second channel layer.

6. A method comprising:
forming an epitaxial stack over a substrate, wherein the epitaxial stack comprises a first sacrificial layer, a first channel layer, a second sacrificial layer, and a second channel layer sequentially over the substrate;
patterning the epitaxial stack into a fin structure extending along a first direction;
forming a dummy gate structure extending across the fin structure along a second direction substantially perpendicular to the first direction;
forming gate spacers respectively on opposite sides of the dummy gate structure;
removing the dummy gate structure to form a gate trench between the gate spacers;
selectively removing the first and second sacrificial layers from the gate trench while leaving the first and second channel layers suspended in the gate trench;
after selectively removing the first and second sacrificial layers, forming recesses respectively in the first and second channel layers, wherein a depth of the recess in the second channel layer is greater than a depth of the recess in the first channel layer; and
after forming the recesses respectively in the first and second channel layers, forming a gate structure in the gate trench and the recesses.

7. The method of claim 6, wherein forming the recesses respectively in the first and second channel layers comprises performing a plasma isotropic etching process to form the recesses in the first and second channel layers.

8. The method of claim 7, wherein the plasma isotropic etching process is performed under a plasma source power of about 450 W to about 4800 W.

9. The method of claim 7, wherein the plasma isotropic etching process is performed under a pressure of about 20 mTorr to about 12000 mTorr.

10. The method of claim 6, further comprising forming an inner spacer between the first and second channel layers prior to forming the recesses respectively in the first and second channel layers.

11. The method of claim 6, wherein after forming the recesses respectively in the first and second channel layers, the first channel layer comprises a center portion and two edge portions on opposite sides of the center portion, and a thickness of the edge portions is greater than a thickness of the center portion.

12. The method of claim 6, wherein after forming the recesses respectively in the first and second channel layers, a minimum thickness of the first channel layer is greater than a minimum thickness of the second channel layer.

13. The method of claim 6, wherein the first sacrificial layer and the second sacrificial layer have substantially the same thickness.

14. A method comprising:
forming a fin structure over a substrate, wherein the fin structure comprises a first sacrificial layer, a first channel layer, a second sacrificial layer, and a second channel layer sequentially over the substrate;
forming a dummy gate structure over the fin structure to define a channel portion in the fin structure and under the dummy gate structure and two source/drain portions in the fin structure and on opposite sides of the channel portion;
forming gate spacers respectively on opposite sides of the dummy gate structure;
removing the source/drain portions of the fin structure;
epitaxially growing source/drain epitaxial structures on opposite sides of the channel portion of the fin structure;
removing the dummy gate structure, the first sacrificial layer, and the second sacrificial layer to form a gate trench surrounded by the gate spacers;
after removing the dummy gate structure, the first sacrificial layer, and the second sacrificial layer, forming a first recess in the first channel layer and in the gate trench, wherein after forming the first recess, the first recess exposes an inner surface of the first channel layer;
forming a gate structure in the gate trench and the first recess; and
forming a second recess in the second channel layer and in the gate trench, wherein after forming the second recess, the second recess exposes an inner surface of the second channel layer, and the second recess is deeper than the first recess.

15. The method of claim 14, wherein the first sacrificial layer and the second sacrificial layer have substantially the same thickness.

16. The method of claim 14, wherein after forming the first recess and the second recess, the first channel layer comprises a first center portion and two first edge portions on opposite sides of the first center portion, the second channel layer comprises a second center portion and two second edge portions on opposite sides of the second center portion, and a thickness difference between the second edge portions and the second center portion is greater than a thickness difference between the first edge portions and the first center portion.

17. The method of claim 14, wherein the first channel layer and the second channel layer have substantially the same thickness.

18. The method of claim 14, wherein prior to forming the first recess, the first channel layer is thicker than the second channel layer.

19. The method of claim 14, wherein forming the gate structure comprises forming the gate structure in the second recess.

20. The method of claim 14, further comprising:
   forming a third recess in the substrate when the first recess is formed.

\* \* \* \* \*